United States Patent
Aoki et al.

(10) Patent No.: US 12,457,843 B2
(45) Date of Patent: Oct. 28, 2025

(54) DISPLAY DEVICE AND METHOD FOR MANUFACTURING DISPLAY DEVICE

(71) Applicant: Magnolia White Corporation, Tokyo (JP)

(72) Inventors: Hayata Aoki, Tokyo (JP); Masumi Nishimura, Tokyo (JP)

(73) Assignee: Magnolia White Corporation, Tokyo (JP)

(*) Notice: Subject to any disclaimer, the term of this patent is extended or adjusted under 35 U.S.C. 154(b) by 342 days.

(21) Appl. No.: 17/579,788

(22) Filed: Jan. 20, 2022

(65) Prior Publication Data

US 2022/0238852 A1    Jul. 28, 2022

(30) Foreign Application Priority Data

Jan. 25, 2021    (JP) ................ 2021-009379

(51) Int. Cl.
| | |
|---|---|
| *H10K 50/11* | (2023.01) |
| *H10K 50/15* | (2023.01) |
| *H10K 50/16* | (2023.01) |
| *H10K 59/131* | (2023.01) |
| *H10K 59/35* | (2023.01) |

(Continued)

(52) U.S. Cl.
CPC ............ *H10K 50/11* (2023.02); *H10K 50/15* (2023.02); *H10K 50/16* (2023.02); *H10K 59/131* (2023.02); *H10K 59/353* (2023.02); *H10K 59/38* (2023.02); *H10K 59/876* (2023.02); *H10K 71/40* (2023.02)

(58) Field of Classification Search
CPC ................ H10K 59/12; H10K 59/131; H10K 59/1315; H10K 59/353; H10K 59/38; H10K 59/876; H10K 50/11; H10K 50/15; H10K 50/16; H10K 71/40; H10K 71/164
See application file for complete search history.

(56) References Cited

U.S. PATENT DOCUMENTS

| | | |
|---|---|---|
| 2004/0160170 A1 | 8/2004 | Sato et al. |
| 2009/0009069 A1 | 1/2009 | Takata |

(Continued)

FOREIGN PATENT DOCUMENTS

| | | |
|---|---|---|
| JP | 2000-195677 A | 7/2000 |
| JP | 2004-207217 A | 7/2004 |

(Continued)

OTHER PUBLICATIONS

Office Action issued on Aug. 27, 2024, in corresponding Japanese Application No. 2021-009379, 10 pages.

*Primary Examiner* — Julio J Maldonado
*Assistant Examiner* — Stanetta D Isaac
(74) *Attorney, Agent, or Firm* — Maier & Maier, PLLC

(57) ABSTRACT

According to one embodiment, a display device includes a lower electrode, a second insulating layer including an opening overlapping the lower electrode, an organic layer including a light-emitting layer, disposed in the opening and covering the lower electrode and an upper electrode covering the organic layer. The light-emitting layer includes a first bottom surface, a first end surface and a second end surface intersecting the first end surface. An angle between the first end surface and the first bottom surface in a cross-sectional view along a first direction is greater than an angle between the second end surface and the first bottom surface in a cross-sectional view along a second direction.

5 Claims, 20 Drawing Sheets

(51) Int. Cl.
*H10K 59/38* (2023.01)
*H10K 59/80* (2023.01)
*H10K 71/40* (2023.01)

(56) References Cited

U.S. PATENT DOCUMENTS

2016/0372527 A1   12/2016  Takashige et al.
2020/0035768 A1*  1/2020   Okabe .................... H10K 50/11
2021/0091158 A1   3/2021   Kasahara

FOREIGN PATENT DOCUMENTS

| JP | 2008-135325 A | 6/2008 |
| JP | 2009-32673 A | 2/2009 |
| JP | 2010-118191 A | 5/2010 |
| JP | WO 2019/026511 A1 | 2/2019 |

* cited by examiner

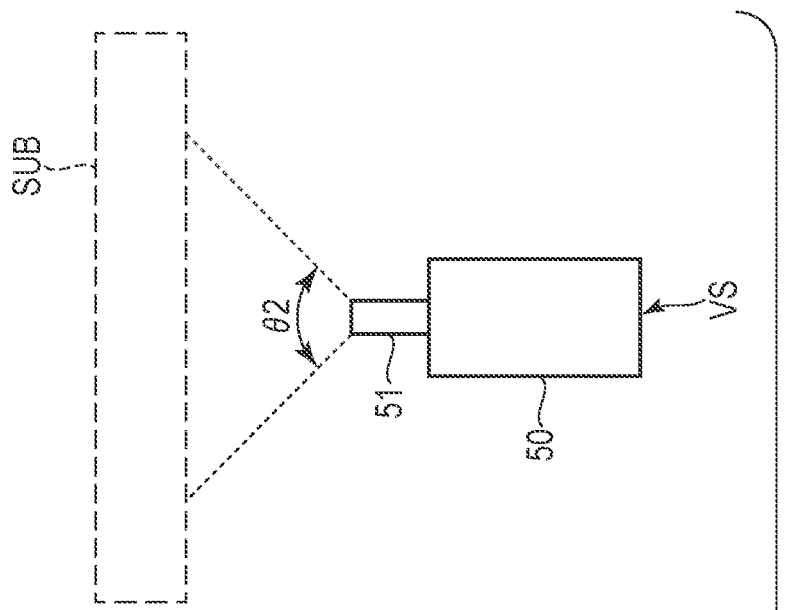
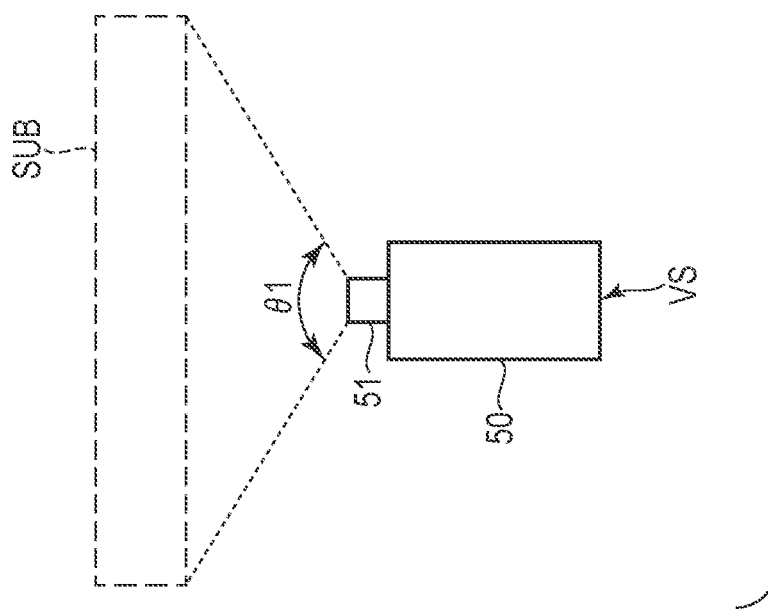
F I G. 4

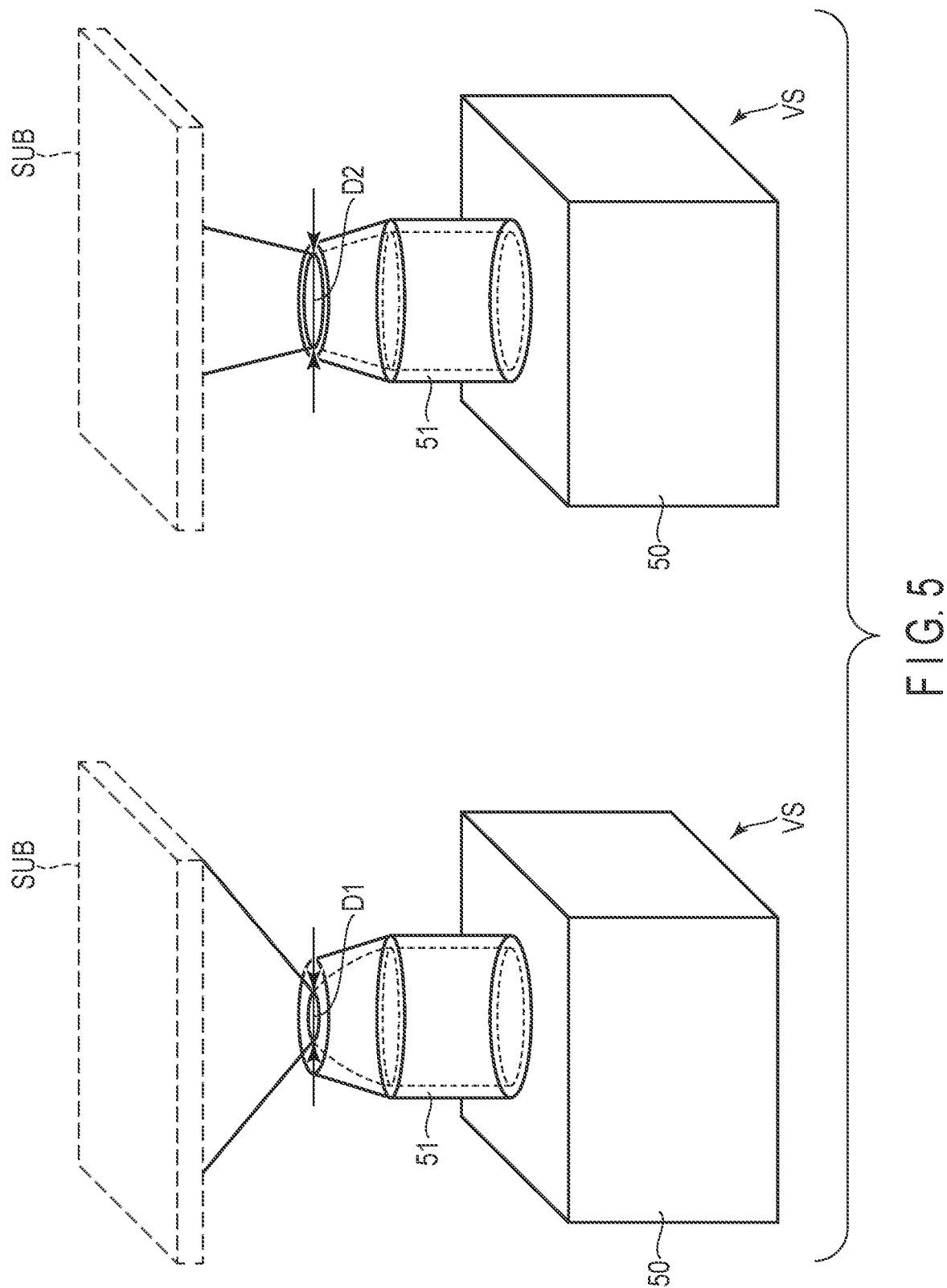
F I G. 5

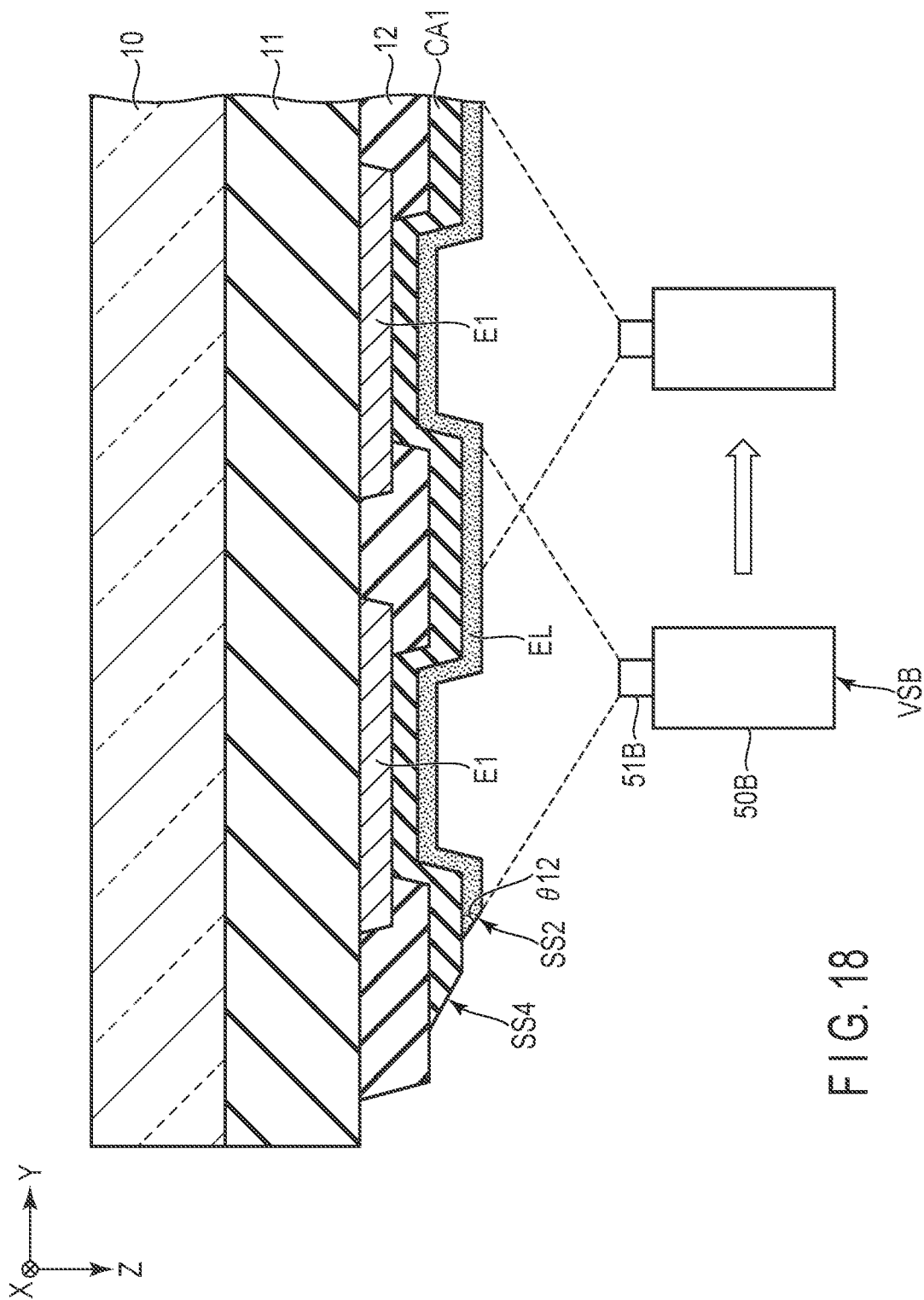
F I G. 18

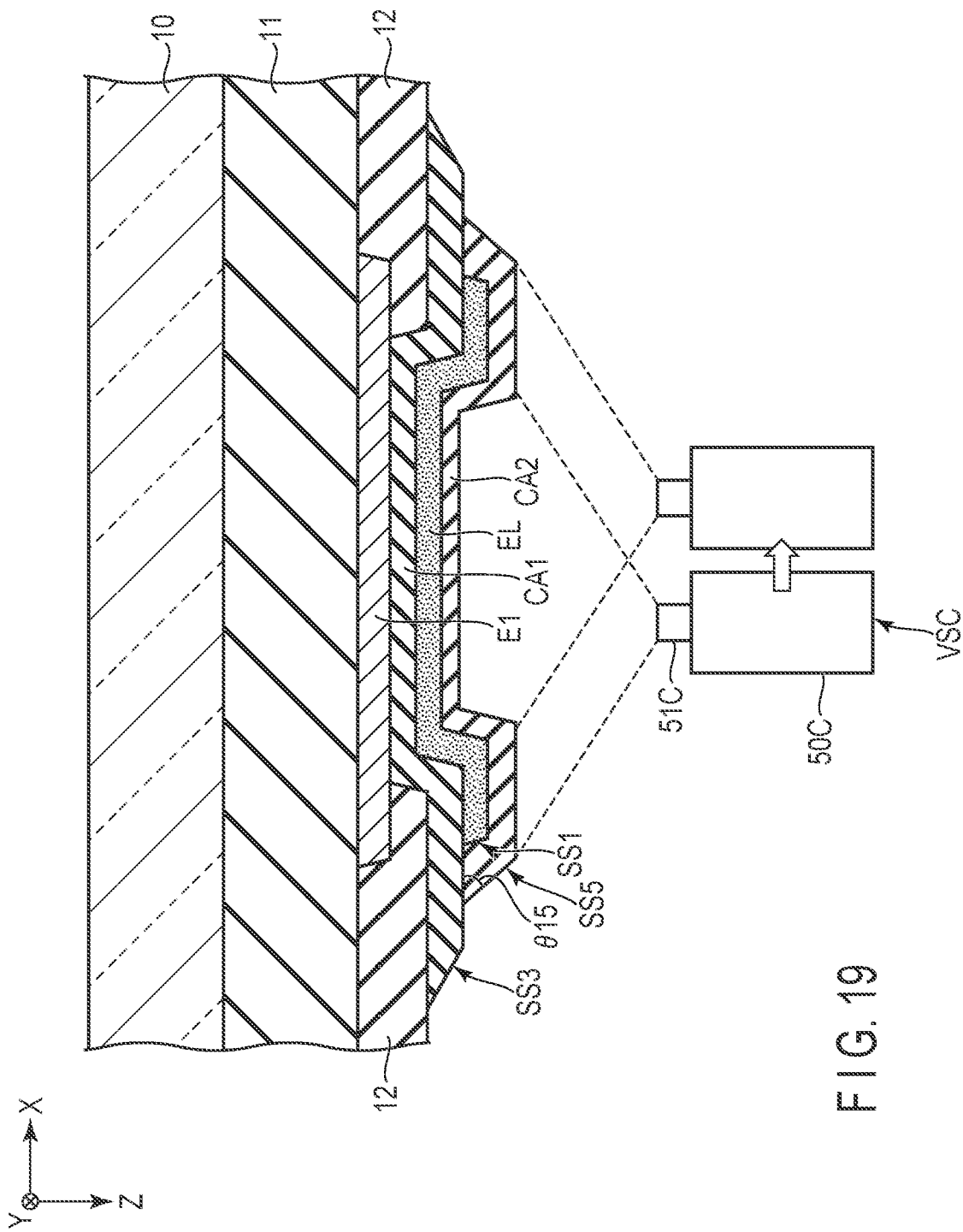
F I G. 19

DISPLAY DEVICE AND METHOD FOR MANUFACTURING DISPLAY DEVICE

CROSS-REFERENCE TO RELATED APPLICATIONS

This application is based upon and claims the benefit of priority from Japanese Patent Application No. 2021-009379, filed Jan. 25, 2021, the entire contents of which are incorporated herein by reference.

FIELD

Embodiments described herein relate generally to a display device and to a method of manufacturing the display device.

BACKGROUND

In recent years, display devices in which organic light-emitting diodes (OLEDs) are applied as display elements have been used in practical applications. The display element comprises an organic layer between a pixel electrode and a common electrode. The organic layer includes, in addition to the light-emitting layer, functional layers such as a hole transport layer and an electron transport layer. Such an organic layer is formed, for example, by the vacuum deposition method.

For example, in the case of the vacuum deposition using mask, a fine mask with openings corresponding to various pixels is applied. However, due to the processing accuracy of the fine mask, deformation of the shape of openings, etc., the accuracy of formation of the thin film formed by the vacuum deposition may be lowered. For example, when forming an organic layer with multiple functional layers stacked one on another, the end surface of the organic layer may not be formed at the desired position, resulting in degradation in performance of the display device.

BRIEF DESCRIPTION OF THE DRAWINGS

FIG. 4 is a diagram illustrating a technique of controlling a radiation angle.

FIG. 5 is a diagram illustrating another technique of controlling the radiation angle.

FIG. 18 is a diagram illustrating a method of manufacturing a plurality of display elements shown in FIG. 16.

FIG. 19 is a diagram illustrating a method of manufacturing a plurality of display elements shown in FIG. 16.

DETAILED DESCRIPTION

Figure 1:
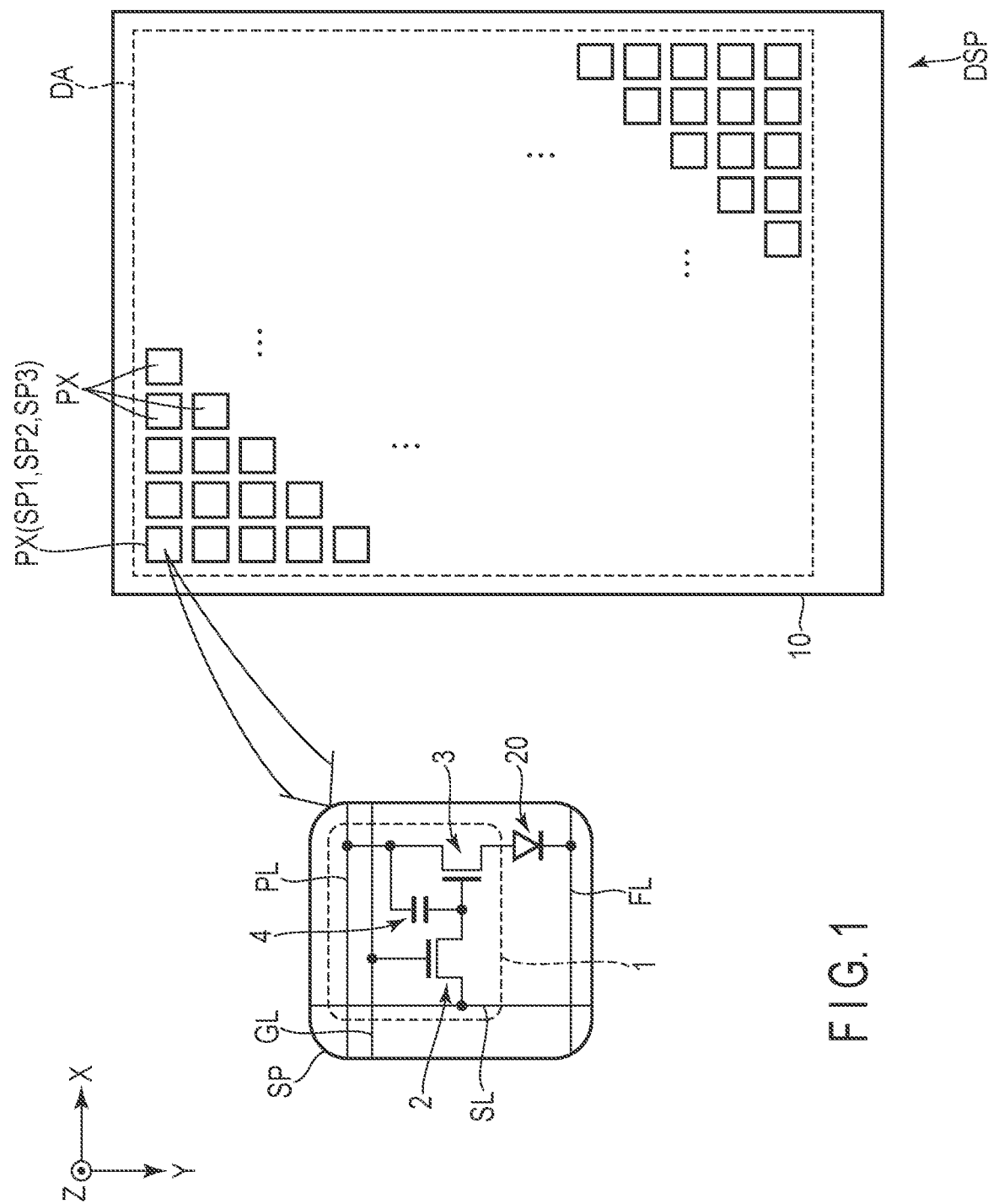
FIG. 1 is a diagram showing a configuration example of a display device DSP according to one embodiment.

In general, according to one embodiment, a display device comprises an insulating substrate, a first insulating layer disposed above the insulating substrate, a lower electrode disposed on the first insulating layer, a second insulating layer disposed on the first insulating layer and comprising an opening overlapping the lower electrode, an organic layer including a light-emitting layer, disposed in the opening and covering the lower electrode and an upper electrode covering the organic layer. The light-emitting layer includes a first bottom surface, a first end surface and a second end surface intersecting the first end surface. An angle between the first end surface and the first bottom surface in a cross-sectional view along a first direction is greater than an angle between the second end surface and the first bottom surface in a cross-sectional view along a second direction intersecting the first direction.

According to another embodiment, a method of manufacturing a display device, comprises forming a lower electrode, forming an organic layer on the lower electrode and forming an upper electrode on the organic layer. The forming the organic layer includes forming a first carrier adjustment layer and forming a light-emitting layer. The forming the first carrier adjustment layer includes depositing a first material while moving a first vapor deposition source along a first direction relative to a processing substrate on which the lower electrode is already formed. The forming the light-emitting layer includes depositing a second material while moving a second vapor deposition source along a second direction intersecting the first direction, relative to the processing substrate on which the first carrier adjustment layer is already formed.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis perpendicular to each other. A direction along the X axis is referred to as an X direction or a first direction, a direction along the Y axis is referred to as a Y direction or a second direction and direction along the Z axis is referred to as a Z direction or a third direction. A plane defined by the X axis and the Y axis is referred to as an X-Y plane. A plane defined by the Y axis and the Z axis is referred to as an Y-Z plane. A plane defined by the X axis and the Z axis is referred to as an X-Z plane. Further, viewing towards the X-Y plane is referred to as planar view.

The display device DSP of this embodiment is an organic electroluminescent display device comprising an organic light-emitting diode (OLED) as a display element, and can be mounted on televisions, personal computers, mobile terminals, cell phones and the like. Note that display element described below can be applied as a light-emitting element of an illumination device, and the display device DSP can be converted to some other electronic device such an illumination device.

FIG. 1 is a diagram showing an example configuration of a display device DSP of this embodiment. The display device DSP comprises a display area DA which displays images, on an insulating base 10. The base 10 is an insulating substrate and may be glass or a flexible resin film.

The display area DA comprises a plurality of pixels PX arranged in a matrix along the first direction X and the second direction Y in the display area DA. The pixels PX each comprises a plurality of subpixels SP1, SP2 and SP3. For example, each pixel PX comprises a red subpixel SP1, a green subpixel SP2 and a blue subpixel SP3. In place of the three subpixels of the three colors, the pixel PX may contain four or more subpixels of other colors, including white.

A configuration example of one subpixel SP contained in a pixel PX will be briefly described.

That is, the subpixel SP comprises a pixel circuit 1 and a display element 20 that is driven and controlled by the pixel circuit 1. The pixel circuit 1 comprises a pixel switch 2, a drive transistor 3 and a capacitor 4. The pixel switch 2 and the drive transistor 3 are switch elements constituted by thin-film transistors, for example.

In the pixel switch 2, a gate electrode thereof is connected to a scanning line GL, a source electrode is connected to a signal line SL and a drain electrode is connected to one of the electrodes constituting the capacitor 4 and the gate electrode of the drive transistor 3. In the drive transistor 3, a source electrode thereof is connected to the other electrode of the capacitor 4 and a power line PL, and a drain electrode is connected to an anode of the display element 20. A cathode of the display element 20 is connected to a power feed line FL. Note that the configuration of the pixel circuit 1 is not limited to that of the example shown in the figure.

The display element 20 is an organic light-emitting diode (OLED), which is a light-emitting element. For example, a subpixel SP1 comprises a display element that emits light corresponding to the red wavelength, a subpixel SP2 comprises a display element that emits light corresponding to the green wavelength, and a subpixel SP3 comprises a display element that emits light corresponding to the blue wavelength. The pixel PX comprises multiple subpixels SP1, SP2 and SP3 of display colors different from each other, and with this configuration, multi-color display can be realized.

Note that the display element 20 may be configured so that the subpixels SP1, SP2 and SP3 emit light of the same color. Thus, monochromatic display can be realized.

Here, when the display elements 20 of the subpixels SP1, SP2 and SP3 are configured to emit white light, a color filter may be disposed to oppose the display elements 20. For example, the subpixel SP1 comprises a red color filter opposing the respective display element 20, the subpixel SP2 comprises a green color filter opposing the respective display element 20, and the subpixel SP3 comprises a blue color filter opposing the respective display element 20. With this structure, it is possible to realize multi-color display.

Alternatively, when the display elements 20 of the subpixels SP1, SP2 and SP3 are configured to emit ultraviolet light, a photo conversion layer is provided to oppose the display elements 20, and thus the multi-color display can be realized.

Figure 2:
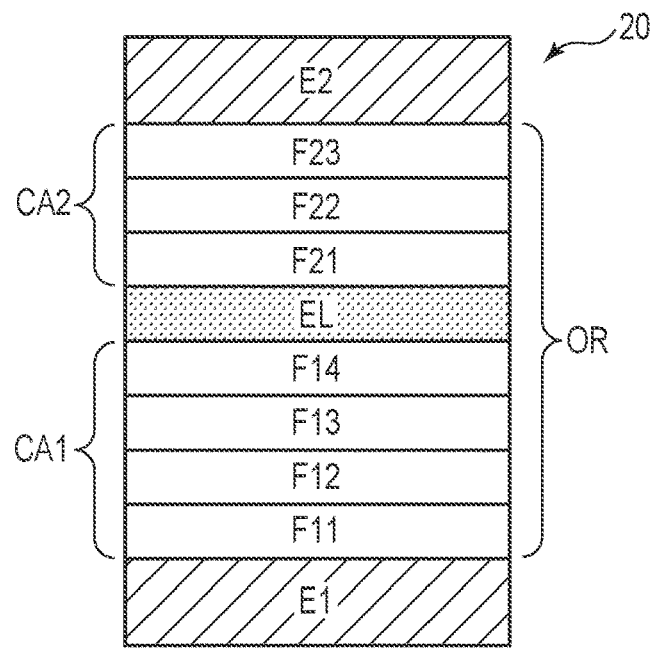
FIG. 2 is a diagram showing an example of a configuration of a display element 20.

FIG. 2 is a diagram showing an example of the configuration of each display element 20.

The display element 20 comprises a lower electrode (first electrode) E1, an organic layer OR and an upper electrode (second electrode) E2. The organic layer OR includes a carrier adjustment layer (first carrier adjustment layer) CA1, a light-emitting layer EL, and a carrier adjustment layer (second carrier adjustment layer) CA2. The carrier adjustment layer CA1 is located between a lower electrode E1 and the light-emitting layer EL, and the carrier adjustment layer CA2 is located between the light-emitting layer EL and an upper electrode E2. The carrier adjustment layers CA1 and CA2 each contain a plurality of functional layers.

Here, the case where the lower electrode E1 corresponds to an anode and the upper electrode E2 corresponds to a cathode will be described as an example.

The carrier adjustment layer CA1 includes a hole injection layer F11, a hole transport layer F12, a carrier generation layer F13, an electron blocking layer F14 and the like as functional layers. The hole injection layer F11 is disposed on the lower electrode E1, the hole transport layer F12 is disposed on the hole injection layer F11, the carrier generation layer F13 is disposed on the hole transport layer F12, the electron blocking layer F14 is disposed on the carrier generation layer F13, and the light-emitting layer EL is disposed on the electron blocking layer F14.

The carrier adjustment layer CA2 includes a hole blocking layer F21, an electron transport layer F22, an electron injection layer F23 and the like, as functional layers. The hole blocking layer F21 is disposed on the light-emitting layer EL, the electron transport layer F22 is disposed on the hole blocking layer F21, the electron injection layer F23 is disposed on the electron transport layer F22, and the upper electrode E2 is disposed on the electron injection layer F23.

Note that in addition to the functional layers described above, the carrier adjustment layers CA1 and CA2 may include other functional layers as needed, or at least one of the functional layers described above may be omitted in the carrier adjustment layers CA1 and CA2.

Figure 3:
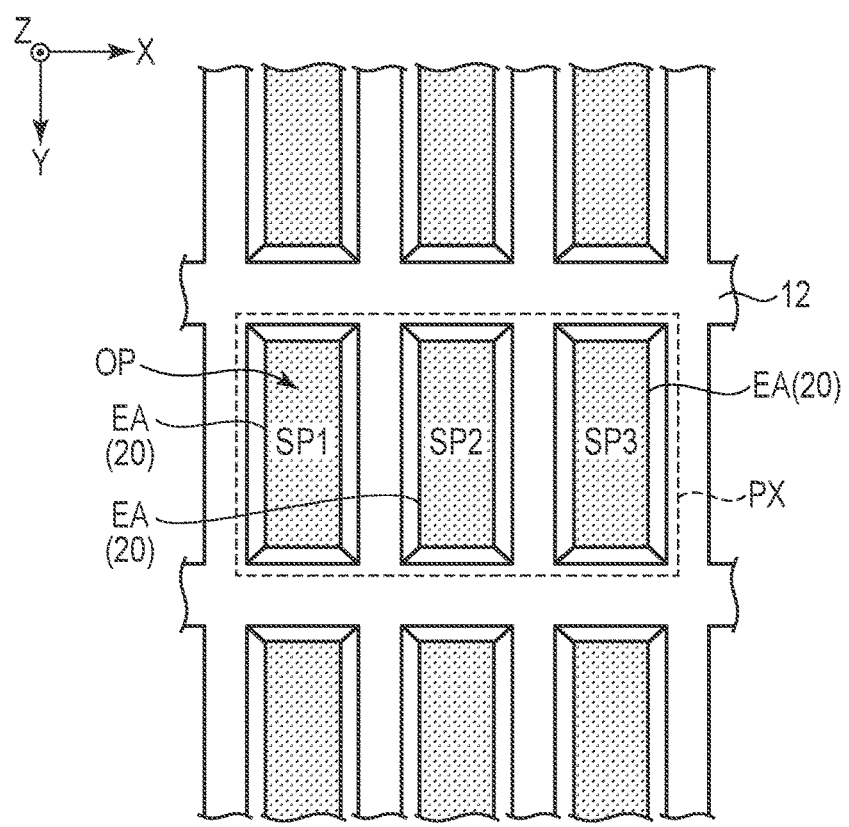
FIG. 3 is a plan view showing an example of a pixel PX shown in FIG. 1.

FIG. 3 is a plan view showing an example of the pixel PX shown in FIG. 1.

The subpixels SP1, SP2 and SP3 that constitute one pixel PX are each formed into a rectangular shape elongated along the second direction Y, and are aligned along the first direction X. The outer shape of the subpixels corresponds to the outer shape of the light-emitting area EA in the display element 20, but it is shown in a simplified way and therefore it does not necessarily reflect the actual shape. Here, it is assumed that the light-emitting area EA is formed into a rectangular shape with short sides extending along the first direction X and long sides extending along the second direction Y.

The insulating layer 12, which will be described in detail later, is formed into a grid pattern extending along the first and second directions X and Y in planar view, which surrounds each of the subpixels SP1, SP2 and SP3, or the display element 20 of each subpixel. The insulating layer 12 with such a configuration may be referred to as ribs, partitions, banks, etc. The light-emitting area EA is formed in each opening OP of the insulating layer 12 and corresponds to the region where the organic layer OR is interposed between the lower electrode E1 and the upper electrode E2.

For example, when the display elements 20 of the subpixels SP1, SP2 and SP3 are configured to emit light of colors different from each other, the first direction X corresponds to a direction in which subpixels of different display colors are aligned, and the second direction Y corresponds to a direction in which subpixels of the same display color are aligned. Alternatively, the subpixels of the same display color may be aligned along a diagonal direction different from the first direction X and the second direction Y.

Each layer of the organic layer OR shown in FIG. 2 is formed by the vapor deposition method. At this time, the radiation angle of the material emitted from the vapor deposition source can be controlled, for example, by the following method.

FIG. 4 is a diagram illustrating one technique of controlling the radiation angle.

A processing substrate SUB is placed to oppose the vapor deposition source VS as indicated by the dotted line. The vapor deposition source VS comprises a crucible 50 that contains a material and a nozzle 51 connected to the crucible 50. The crucible 50 is heated by a heating mechanism. The vapor of the material generated by heating the crucible 50 is emitted at a radiation angle θ.

FIG. 4 illustrates one technique of controlling the radiation angle (or directivity of the vapor) 8 by the shape of the nozzle 51. Here, the nozzle shown on the left side of the figure is referred to as a first nozzle 51, and the nozzle shown on the right side of the figure is referred to as a second nozzle 51. The shape of the first nozzle 51 is different from the shape of the second nozzle 51.

More specifically, the first nozzle 51 is thicker and shorter than the second nozzle 51. The radiation angle θ1 of the vapor of the material emitted from the first nozzle 51 is greater than a radiation angle θ2 of the vapor of the material emitted from the second nozzle 51 (θ1>θ2). In other words, the vapor emitted from the first nozzle 51 spreads easily (having small directivity). On the other hand, the vapor emitted from the second nozzle 51 does not easily spread (having high directivity).

FIG. 5 is a diagram illustrating another method of controlling the radiation angle.

In the example shown in FIG. 5 as well, the shape of the first nozzle 51 is different from that of the second nozzle 51. Here, an opening diameter D1 of the first nozzle 51 is less than an opening diameter D2 of the second nozzle 51 (D1<D2). In such an example, the vapor of the material emitted from the first nozzle 51 spreads easily, whereas the vapor of the material emitted from the second nozzle 51 does not spread easily.

Figure 6:
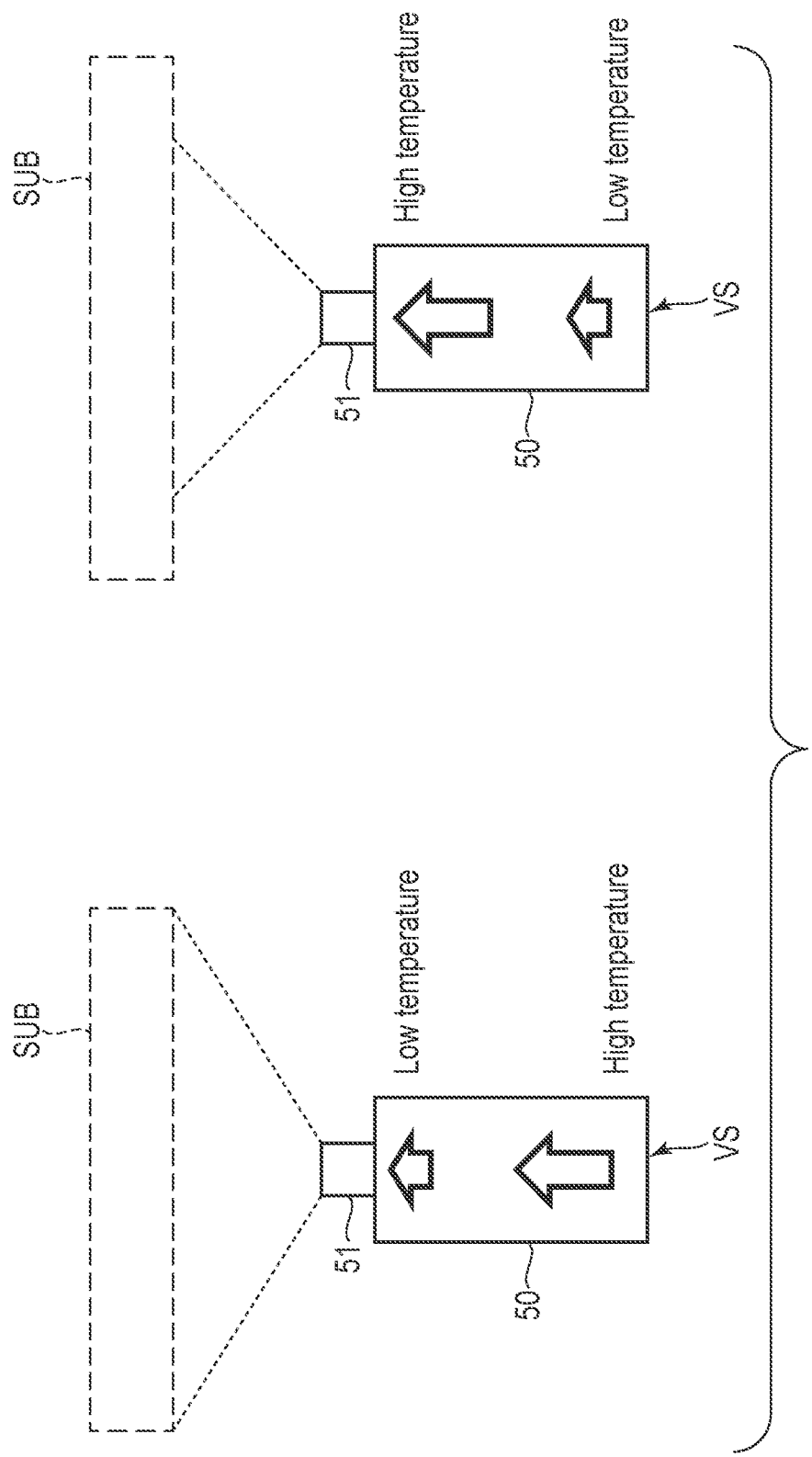
FIG. 6 is a diagram illustrating still another technique of controlling the radiation angle.

FIG. 6 is a diagram illustrating another method of controlling the radiation angle.

In the example shown in FIG. 6, the crucible shown on the left side of the figure is referred to as a first crucible 50, and the crucible shown on the right side of the figure is referred to as a second crucible 50. The temperature distribution of the first crucible 50 is different from that of the second crucible 50. For example, the heating temperature in a bottom side of the first crucible 50 is set higher than the heating temperature in a nozzle side, and the heating temperature in a bottom side of the second crucible 50 is set lower than the heating temperature in a nozzle side. Thus, by adjusting the temperature distributions of the crucibles, the radiation angle of the vapor can be controlled. In the example shown in FIG. 6, the vapor of the material emitted from the first nozzle 51 easily spreads, whereas the vapor of the material emitted from the second nozzle 51 does not easily spread.

The deposition of each layer that constitutes the organic layer OR is carried out while moving the vapor deposition source VS relative to the processing substrate SUB. In other words, the vapor deposition source VS may be moved with respect to the fixed processing substrate SUB, the processing substrate SUB may be moved with respect to the fixed vapor deposition source VS, or both the processing substrate SUB and the vapor deposition source VS may be moved.

The cross-sectional shape of the layer LY formed by the method described above will be described. Here, the direction in which the vapor deposition source VS is moved is referred to as a direction DR2, and the direction perpendicular to the direction DR2 is referred to as a direction DR1. As the vapor deposition source VS is moved in the direction DR2, the material emitted from the source VS is deposited on the processing substrate SUB. Thus, the layer LY is formed on the surface of the processing substrate SUB.

Figure 7A:
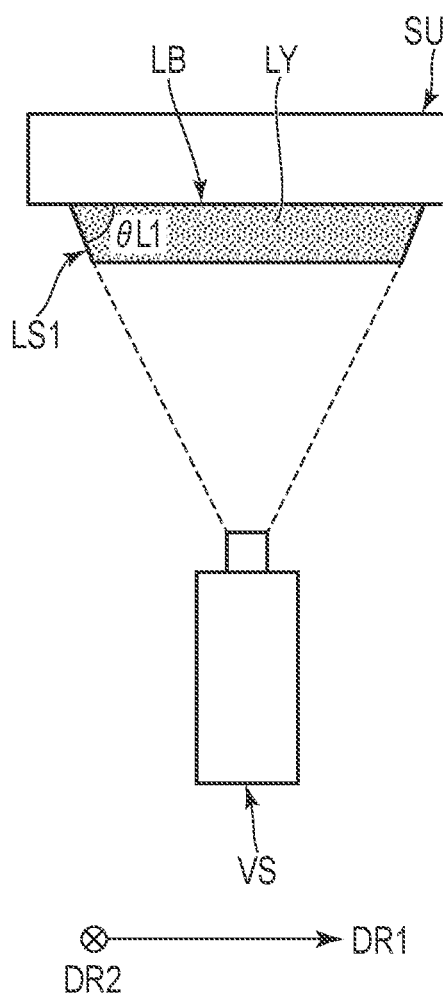
FIG. 7A is a cross-sectional view showing a layer LY taken along a direction DR1.

FIG. 7A shows a cross-sectional shape of the layer LY taken along the direction DR1. The layer LY includes a bottom surface LB and an end surface LS1. The angle between the bottom surface LB and the end surface LS1 is referred to as an inclination angle θL1 of the end surface LS1. The end surface LS1 is equivalent to an end surface along the direction DR2 in which the vapor deposition source VS is moved.

Figure 7B:
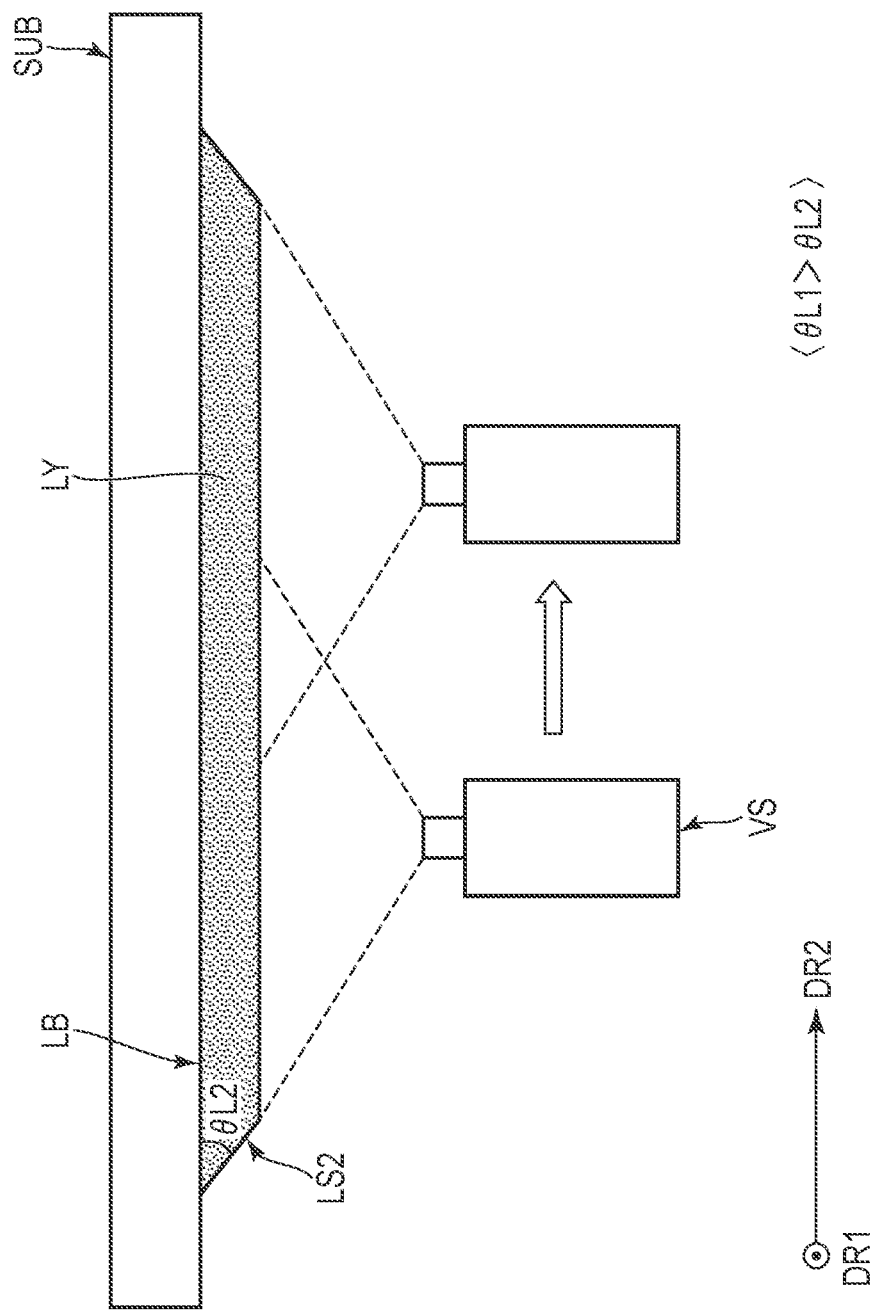
FIG. 7B is a cross-sectional view showing a layer LY taken along a direction DR2.

FIG. 7B shows a cross-sectional shape of the layer LY taken along the direction DR2. The layer LY further includes an end surface LS2. The angle between the bottom surface LB and the end surface LS2 is referred to as an inclination angle θL2 of the end surface LS2. The end surface LS2 is equivalent to an end surface perpendicular to the direction DR2 in which the vapor deposition source VS is moved, or an end surface along the direction DR1. Note that the inclination angle GL2 is less than the inclination angle θL1 (θL2<θL1).

Figure 8A:
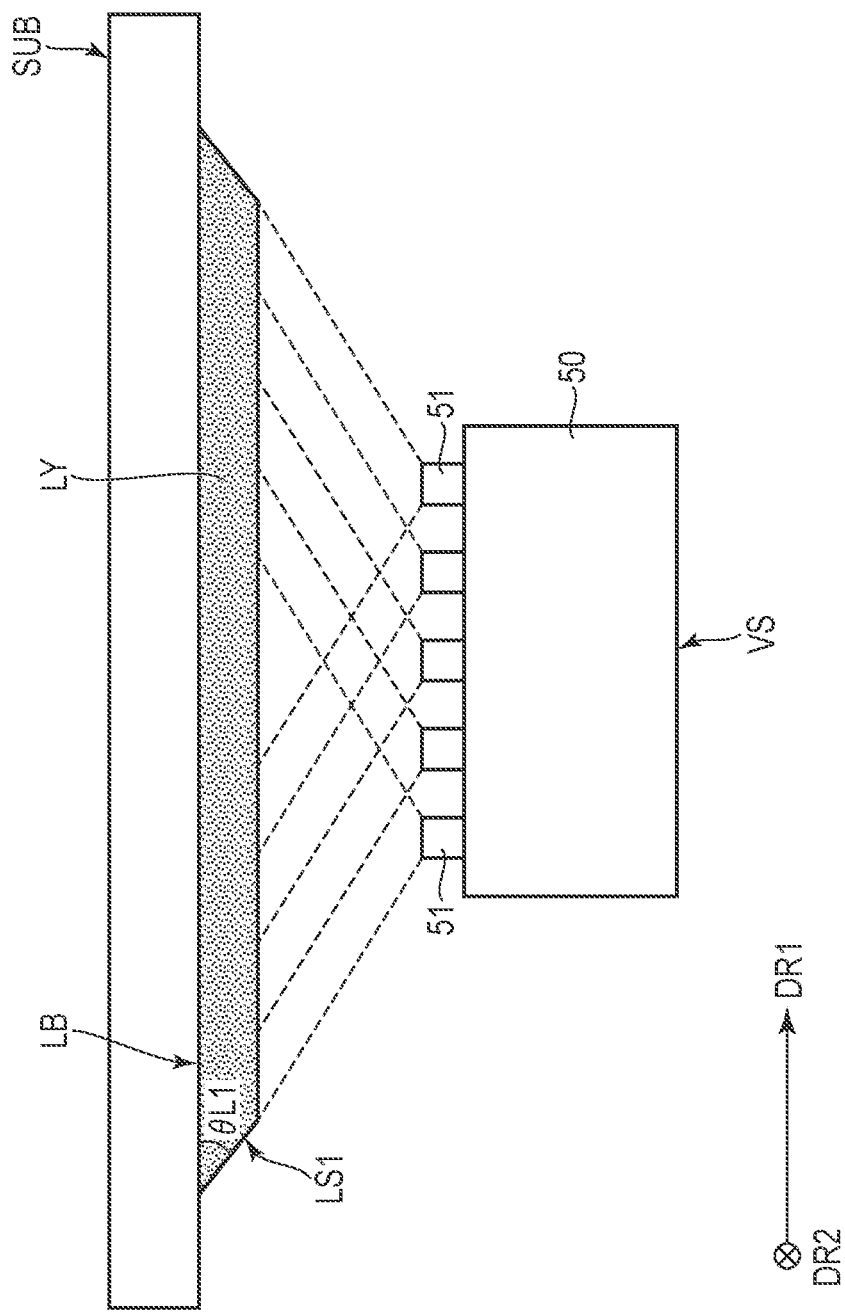
FIG. 8A is another cross-sectional view showing a layer LY taken along the direction DR1.

FIG. 8A shows another cross-sectional shape of the layer LY taken along the direction DR1. In the example shown here, the vapor deposition source VS includes a plurality of nozzles 51 aligned at intervals along the direction DR1. The end surface LS1 is equivalent to an end surface along the direction DR2 in which the vapor deposition source VS is moved. The angle between the bottom surface LB and the end surface LS1 is referred to as an inclination angle θL1 of the end surface LS1.

Figure 8B:
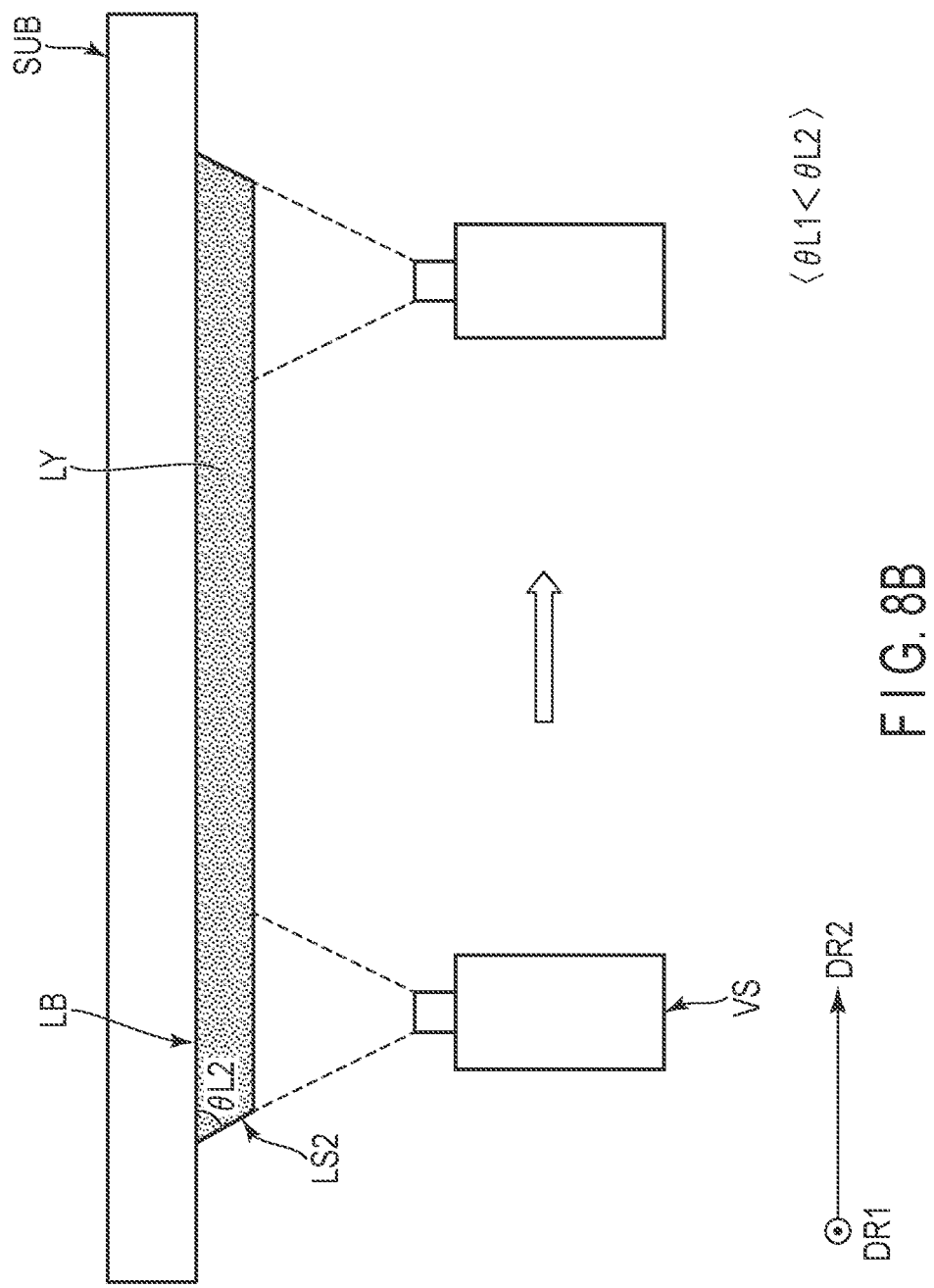
FIG. 8B is another cross-sectional view showing a layer LY taken along the direction DR2.

FIG. 8B shows another cross-sectional shape of the layer LY taken along the direction DR2. The end surface LS2 is equivalent to an end surface perpendicular to the direction DR2 in which the vapor deposition source VS moves shown in FIG. 8A is moved, or an end surface along the direction DR1. The angle between the bottom surface LB and the end surface LS2 is referred to as an inclination angle θL2 of the end surface LS2. The inclination angle θL2 is greater than the inclination angle θL1 (θL2>θL1).

Figure 9:
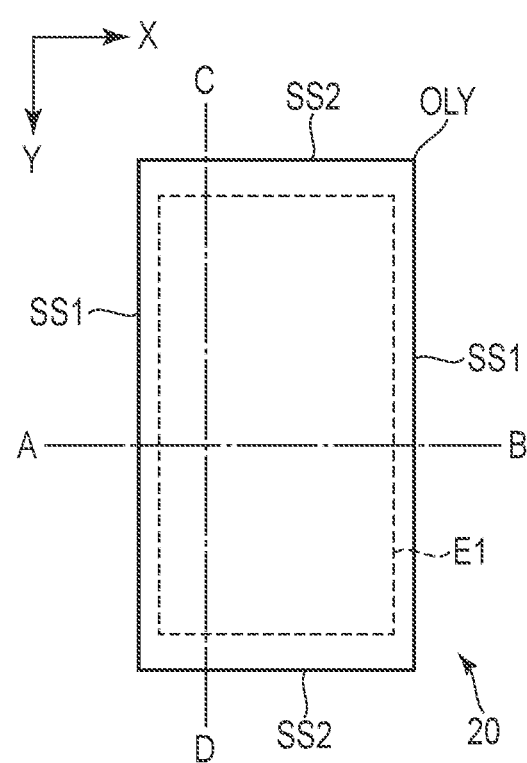
FIG. 9 is a plan view showing an example of the display element 20.

FIG. 9 is a plan view showing an example of the display element 20. Here, only the configuration necessary for explanation is illustrated.

In a plan view, at least one layer OLY, which constitutes the organic layer OR, overlaps the lower electrode E1 indicated by the dotted lines. The layer OLY is, for example, a light-emitting layer EL, but it may be some other functional layer. The layer OLY includes a pair of end surfaces (first end surfaces) SS1 opposing each other along the first direction X and a pair of end surfaces (second end surfaces) SS2 opposing each other along the second direction Y. The end surfaces SS1 extend along the second direction Y, and the end surfaces SS2 extend along the first direction X. The end surfaces SS1 and the end surfaces SS2 intersect each other. The length of the end surfaces SS1 along the second direction Y is greater than the length of the end surfaces SS2 along the first direction X.

Figure 10:
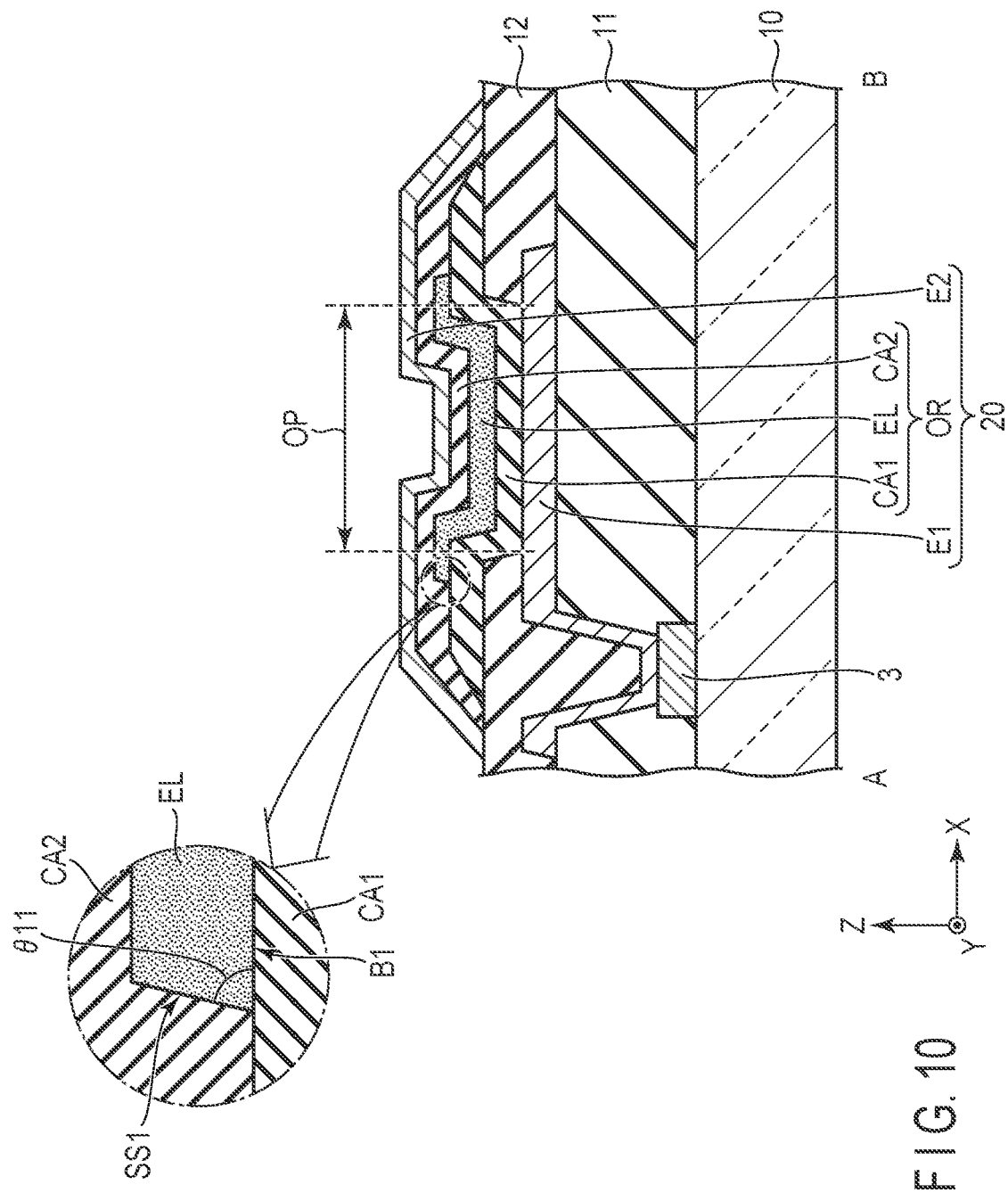
FIG. 10 is a cross sectional view showing an example of the display element 20, taken along line A-B in FIG. 9.

FIG. 10 is a cross-sectional view showing an example of the display element 20 taken along line A-B shown in FIG. 9.

The pixel circuit 1 shown in FIG. 1 is disposed on the base 10 and covered by an insulating layer 11. In FIG. 10, the drive transistor 3 contained in the pixel circuit 1 is shown in a simplified form. The insulating layer (first insulating layer) 11 is equivalent to an underlying layer of the display element 20. The insulating layer (second insulating layer) 12 is disposed on the insulating layer 11. The insulating layers 11 and 12 are, for example, organic insulating layers.

The lower electrode E1 is disposed on the insulating layer 11. The lower electrode E1 is an electrode provided for each sub-pixel or each display element, and is electrically connected to the drive transistor 3. The lower electrode E1 with such a structure may be referred to as a pixel electrode, anode or the like.

The lower electrode E1 is, for example, a metal electrode formed of a metal material such as silver or aluminum. Note that the lower electrode E1 may be, for example, a transparent electrode formed of a transparent conductive material such as indium tin oxide (ITO) or indium zinc oxide (IZO). Or the lower electrode E1 may as well be a stacked body of a transparent electrode and a metal electrode. For example, the lower electrode E1 may be configured as a stacked body in which a transparent electrode, a metal electrode and a transparent electrode are stacked in this order, or may be configured as a stacked body of three or more layers. In the display device 20 of a top emission type, the lower electrode E1 includes a metal electrode as a reflective electrode.

The insulating layer 12 has an opening OP. The opening OP is a through hole formed in the region overlapping the lower electrode E1 and penetrating the insulating layer 12 to the lower electrode E1. The peripheral portion of the lower electrode E1 is covered by the insulating layer 12, and the central portion of the lower electrode E1 is exposed from the insulating layer 12 in the opening OP.

The organic layer OR includes carrier adjustment layers CA1 and CA2 and the light-emitting layer. The organic layer OR is disposed in the opening OP and covers the lower electrode E1. The carrier adjustment layer CA1 is located between the lower electrode E1 and the light-emitting layer EL, and the carrier adjustment layer CA2 is located between the light-emitting layer EL and the upper electrode E2.

The carrier adjustment layer CA1 illustrated in the figure is equivalent to at last one of the hole injection layer F11, the hole transport layer F12, the carrier generation layer F13 and the electron blocking layer F14 shown in FIG. 2. Further, the carrier adjustment layer CA2 is equivalent to at least one of the hole blocking layer F21, the electron transport layer F22 and the electron injection layer F23 shown in FIG. 2.

The upper electrode E2 covers the organic layer OR. The upper electrode E2 may be referred to as a common electrode, a counter electrode, a cathode or the like.

The upper electrode E2 is a semi-transmissive metal electrode formed, for example, of a metal material such as magnesium or silver. The upper electrode E2 may be a transparent electrode formed of a transparent conductive material such as ITO or IZO. Further, the upper electrode E2 may as well be a stacked body of a transparent electrode and a metal electrode. The upper electrode E2 is electrically connected to a power feed line disposed in the display area DA or on an outer side of the display area DA.

A portion of the organic layer OR that is located between the lower electrode E1 and the upper electrode E2 without interposing the insulating layer 12, can form the light-emitting region of the display element 20. For example, the thickness of the organic layer OR along the third direction Z is set as to match the peak wavelength of the emission spectrum in the light-emitting layer EL with the effective optical path length between the lower electrode E1 and the upper electrode E2. With this configuration, a microcavity structure for obtaining the resonance effect can be realized.

On the upper electrode E2, an optical adjustment layer to improve the light extraction efficiency and a sealing layer to protect the display element 20 from moisture, etc., are provided though they are not illustrated in the figure.

FIG. 10 is an enlarged view of a region of the light-emitting layer EL, including the end surface. Here, the case where the layer OLY shown in FIG. 9 is the light-emitting layer EL in FIG. 10 will be described. The bottom surface (first bottom surface) B1 of the light-emitting layer EL is in contact with the carrier adjustment layer CA1. In the cross-sectional view along the X-Z plane defined by the first direction X and the third direction Z, the angle θ11 between the end surface SS1 and the bottom surface B1 (the inclination angle θ11 of the end surface SS1) is an acute angle.

The end surface SS1 is located above the carrier adjustment layer CA1 and is in contact with the carrier adjustment layer CA2. The carrier adjustment layer CA2 covers the light-emitting layer EL and also covers the carrier adjustment layer CA1 on an outer side of the light-emitting layer EL so as to be in contact with the insulating layer 12. The upper electrode E2 is in contact with the insulating layer 12 on an outer side of the carrier adjustment layer CA2.

Figure 11:
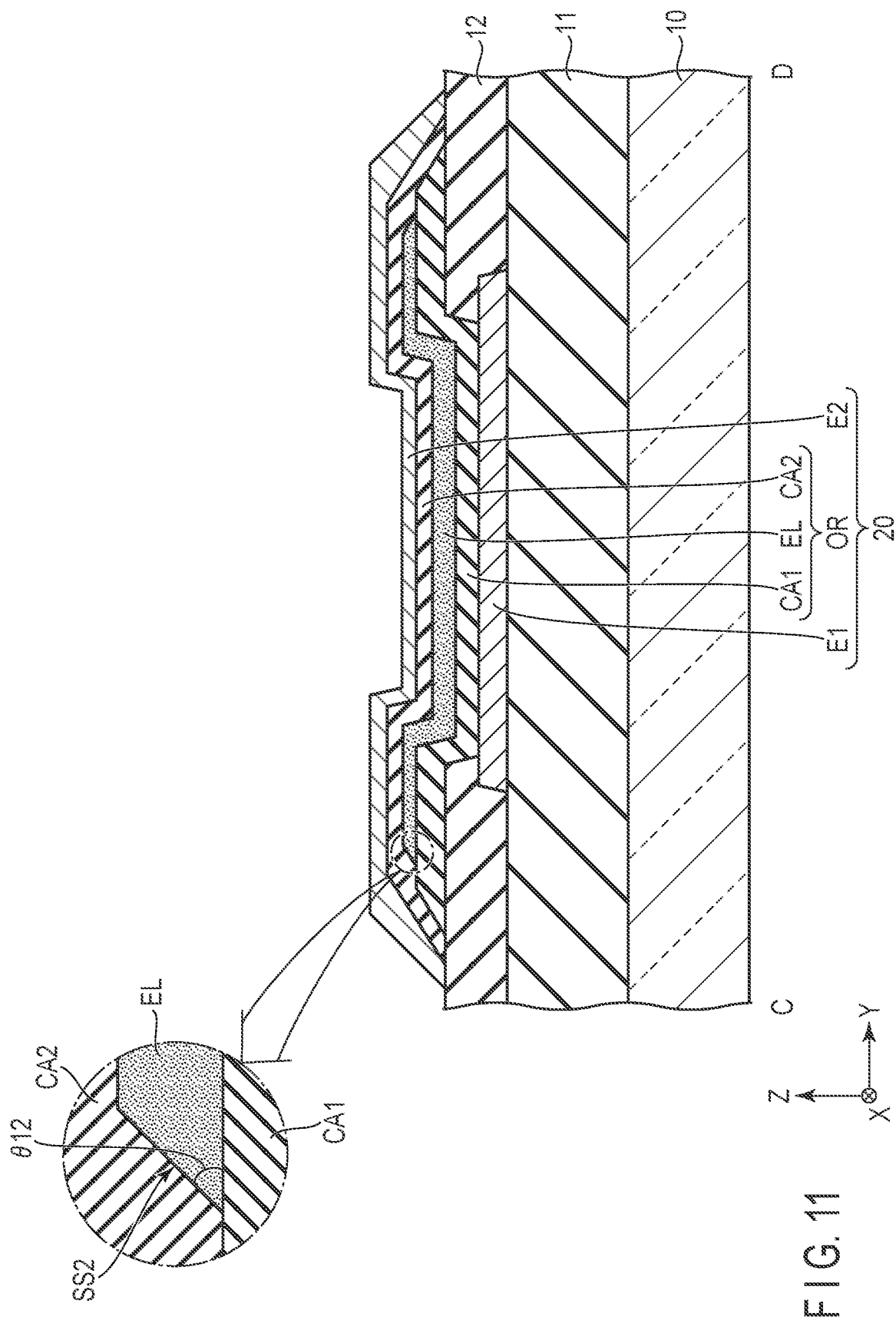
FIG. 11 is a cross sectional view showing an example of the display element 20, taken along line C-D in FIG. 9.

FIG. 11 is a cross-sectional view showing an example of the display element 20 taken along line C-D shown in FIG. 9.

In the cross-sectional view along the Y-Z plane defined by the second direction Y and the third direction Z, the angle θ12 between the end surface SS2 and the bottom surface B1 (the inclination angle θ12 of the end surface SS2) is an acute angle. The inclination angle θ11 of the end surface SS1 shown in FIG. 10 is greater than the inclination angle θ12 of the end surface SS2 shown in FIG. 11 (θ12<θ11).

The end surface SS2 is located above the carrier adjustment layer CA1 and is in contact with the carrier adjustment layer CA 2. As shown in FIGS. 10 and 11, the carrier adjustment layer CA2 covers the entire light-emitting layer EL including the end surfaces SS1 and SS2. Further, in the Y-Z plane, the carrier adjustment layer CA2 covers the carrier adjustment layer CA1 on an outer side of the light-emitting layer EL so as to be in contact with the insulating layer 12. Furthermore, the upper electrode E2 is in contact with the insulating layer 12 on an outer side of the carrier adjustment layer CA2.

Next, a method of forming a light-emitting layer EL having the cross-sectional shape described above will be described.

Figure 12:
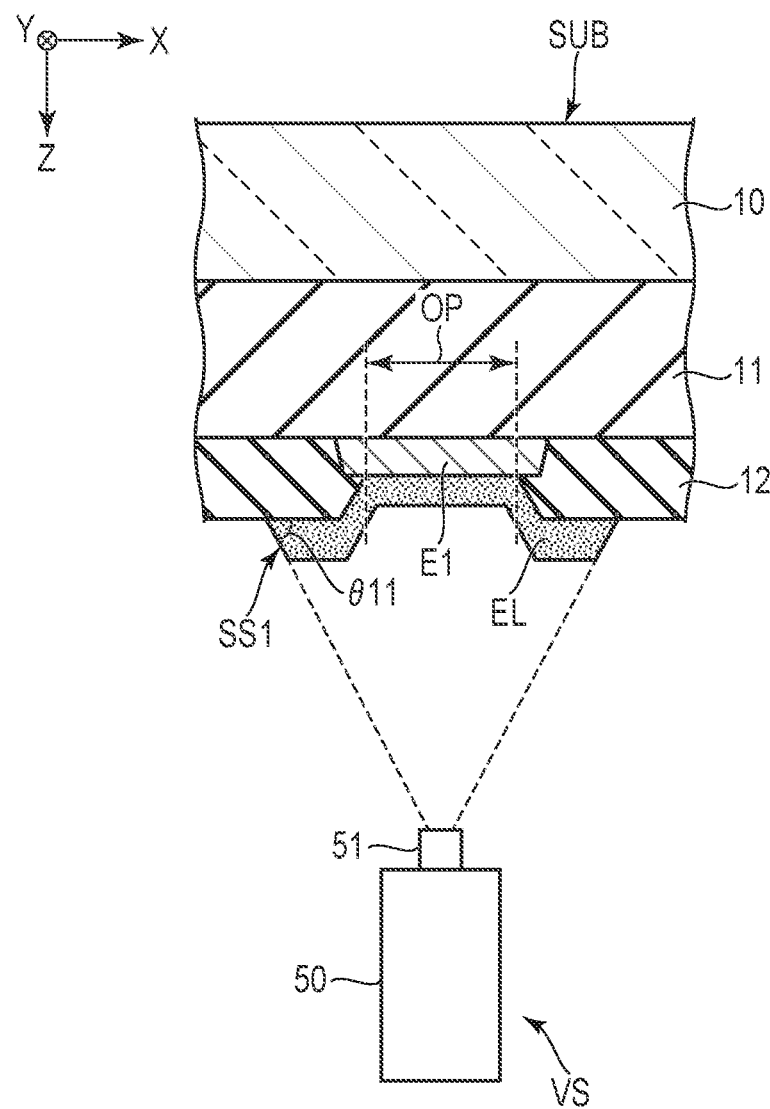
FIG. 12 is a diagram illustrating a method of manufacturing the display element 20 shown in FIG. 11.

FIG. 12 is a diagram illustrating a method of manufacturing the display element 20 shown in FIG. 11.

First, a processing substrate SUB is prepared. The processing substrate SUB is obtained by the following process. That is, the insulating layer 11 is formed on the base 10, and then the lower electrode E1 is formed on the insulating layer 11. Thereafter, the insulating layer 12 having an opening overlapping the lower electrode E1 is formed.

The processing substrate SUB is then set such that the insulating layer 12 and the vapor deposition source VS face each other. After that, the layers each constituting the organic layer OR are formed by the vapor deposition method. In FIG. 12, the carrier adjustment layer CA1 is omitted from the illustration. The light-emitting layer EL is a mixed layer (co-deposited layer) containing a host material and a light-emitting material which is a guest material.

Note that when the sublimation temperature of the host material is different from that of the light-emitting material, the host material and the light-emitting material are loaded in separate crucibles and heated to the respective predetermined temperatures, but for simplicity, only one crucible 50 is illustrated here. The direction in which the vapor deposition source VS is moved is the second direction Y. In the cross section taken along the direction perpendicular to the movement direction of the vapor deposition source VS as shown in FIG. 12, for example, the radiation angle of the vapor emitted from the vapor deposition source VS is controlled by the technique described with reference to FIGS. 4 to 6. Thus, the end surface SS1 with an inclination angle $\theta 11$ is formed at a position overlapping the insulating layer 12.

Figure 13:
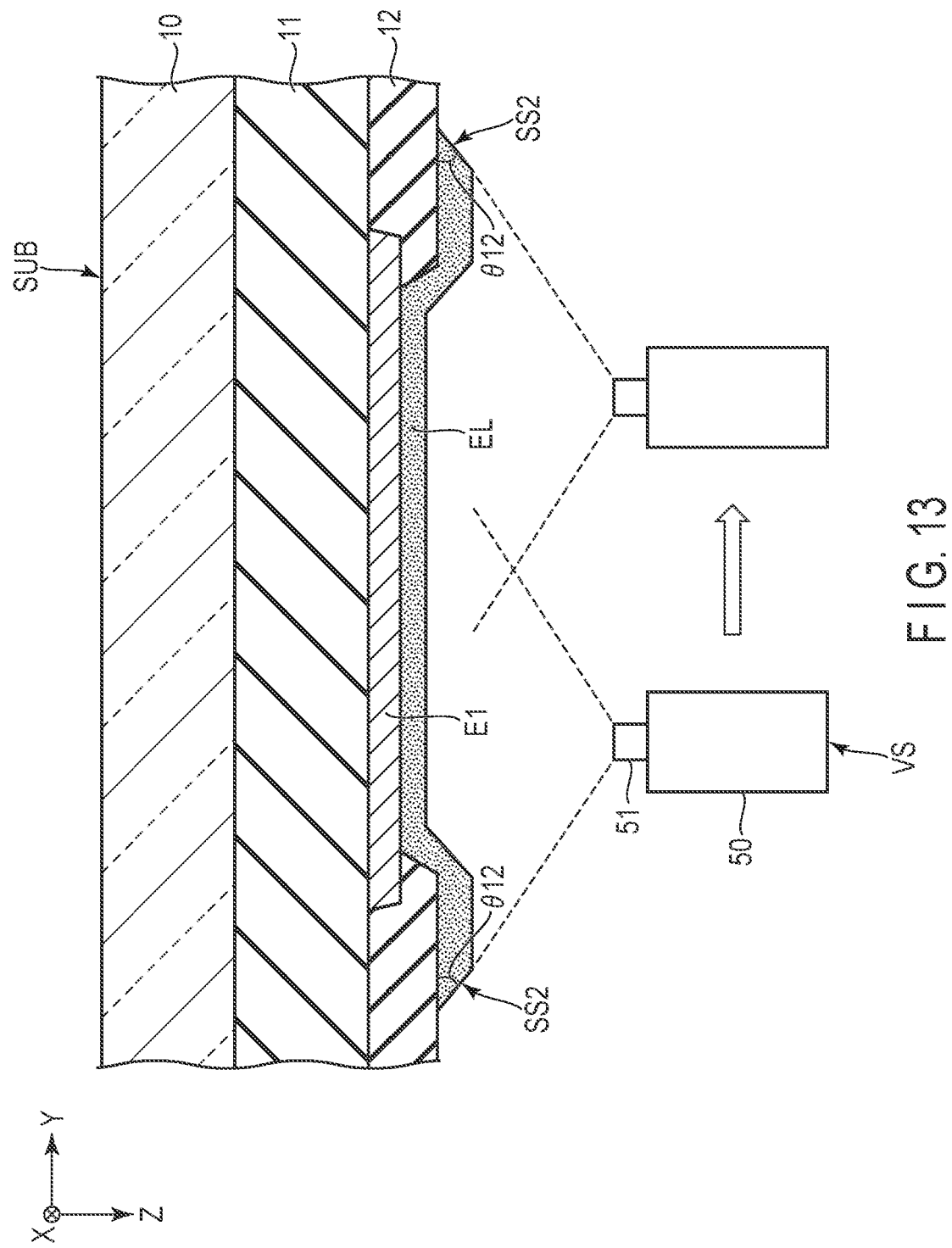
FIG. 13 is a diagram illustrating a method of manufacturing the display element 20 shown in FIG. 11.

FIG. 13 is a diagram illustrating the method of manufacturing the display element 20 shown in FIG. 11.

The vapor deposition source VS is moved in the second direction Y while emitting vapor. Thus, the light-emitting layer EL including an end surface SS2 with an inclination angle $\theta 12$ is formed at a position overlapping the insulating layer 12. The inclination angle $\theta 11$ of the end surface SS1 shown in FIG. 12 is greater than the inclination angle $\theta 12$ of the end surface SS2 shown in FIG. 13 ($\theta 12<\theta 11$). Note that as explained with reference to FIGS. 7A and 7B, or FIGS. 8A and 8B, depending on the deposition method, the inclination angle $\theta 11$ may be less than the inclination angle $\theta 12$ ($\theta 12>\theta 11$).

When sub-pixels of different display colors are located adjacent to each other in the first direction X, the light-emitting layers EL having different light-emitting colors are arranged adjacent to each other along the first direction X, and the end surfaces SS1 thereof oppose each other. Here, the inclination angle $\theta 11$ of the end surface SS1 in each light-emitting layer EL is greater than the inclination angle $\theta 12$ of the end surface SS2, an interval between adjacent light-emitting layers EL (an interval between opposing end surfaces SS1) can be secured. With this structure, undesired light emission, which may be caused by carrier migration between adjacent sub-pixels can be suppressed and moreover, the desired chromaticity can be obtained.

Further, the carrier adjustment layer CA2 is in contact with the end surfaces SS1 and SS2 of the light-emitting layer EL and also covers the light-emitting layer EL and the carrier adjustment layer CA1. With this structure, undesired current leakage in the peripheral portion of the organic layer OR can be suppressed. Therefore, the degradation in performance of the display device 20 can be suppressed.

Figure 14:
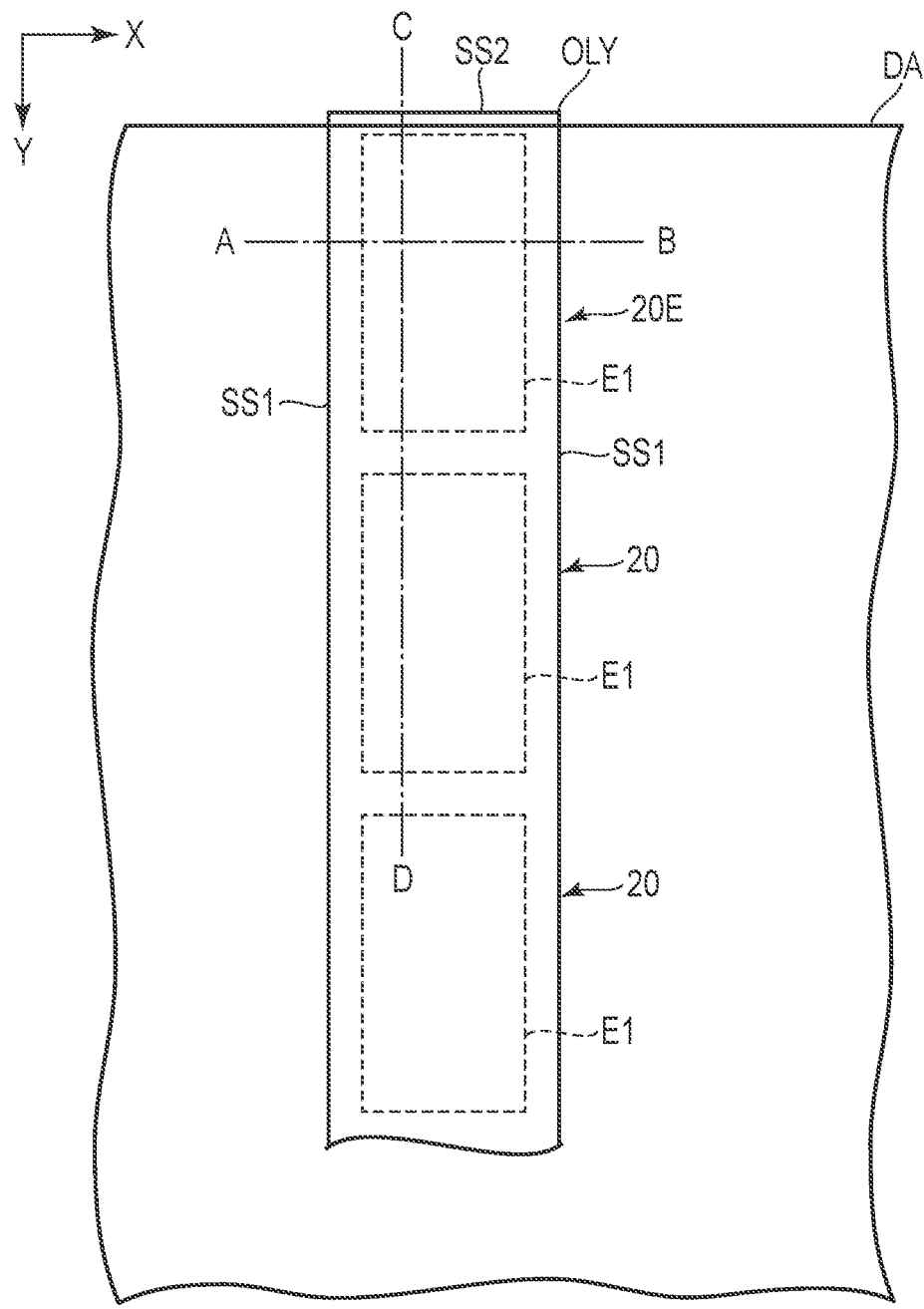
FIG. 14 is a plan view showing another example of the display element 20.

FIG. 14 is a plan view showing another example of the display element 20. Here, only the configuration necessary for explanation is illustrated.

The display elements 20 aligned along the second direction Y are configured to emit the same color. In other words, the second direction Y is equivalent to the direction in which sub-pixels of the same display color are aligned. Of these display elements 20, the display element 20E is located at the outermost circumference of the display area DA.

In these display elements 20, at least one layer OLY which constitutes the organic layer OR is a common layer that overlaps the plurality of lower electrodes E1 indicated by dotted lines. The layer OLY is, for example, the light-emitting layer EL, but it may be some other functional layer. The layer OLY includes an end surface (first end surface) SS1 extending along the second direction Y, and an end surface (second end surface) SS2 extending along the first direction X.

Figure 15:
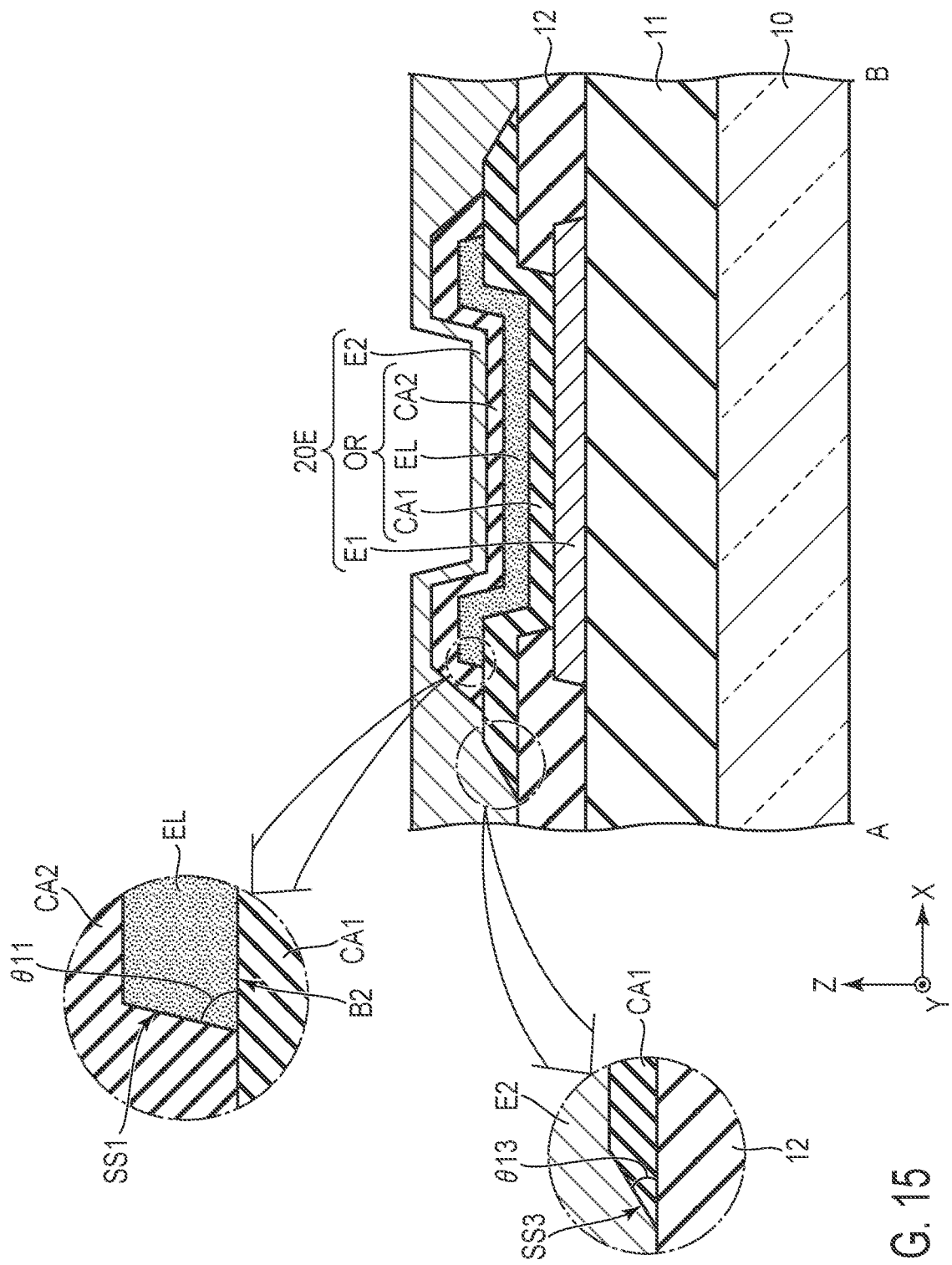
FIG. 15 is a cross sectional view showing an example of a display element 20E, taken along line A-B in FIG. 14.

FIG. 15 is a cross-sectional view showing an example of the display element 20E taken along line A-B shown in FIG. 14. The cross-sectional shape taken along the X-Z plane is not limited to that of the display element 20E, but it is also the case for the other display elements 20.

The organic layer OR includes a light-emitting layer EL, a carrier adjustment layer CA1 between the lower electrode E1 and the light-emitting layer EL, and a carrier adjustment layer CA2 between the light-emitting layer EL and the upper electrode E2. The carrier adjustment layer CA1 is equivalent to at least one of the hole injection layer F11, the hole transport layer F12, the carrier generation layer F13 and the electron blocking layer F14 shown in FIG. 2. The carrier adjustment layer CA2 is equivalent to at least one of the hole blocking layer F21, the electron transport layer F22 and the electron injection layer F23 shown in FIG. 2.

FIG. 15 shows an enlarged view of each of the region including the end surface of the carrier adjustment layer CA1 and the region including the end surface of the light-emitting layer EL. The bottom surface (first bottom surface) B1 of the light-emitting layer EL is in contact with the carrier adjustment layer CA1. In the cross-sectional view taken along the X-Z plane, the angle $\theta 11$ between the end surface SS1 and the bottom surface B1 (the inclination angle $\theta 11$ of the end surface SS1) is an acute angle.

The carrier adjustment layer CA1 includes a bottom surface (second bottom surface) B2 and an end surface (third end surface) SS3. The bottom surface B2 is in contact with the insulating layer 12. In the cross-sectional view taken along the X-Z plane, the angle $\theta 13$ between the end surface SS3 and the bottom surface B2 (the inclination angle $\theta 13$ of the end surface SS3) is an acute angle. The inclination angle $\theta 13$ of the end surface SS3 is less than the inclination angle $\theta 11$ of the end surface SS1 ($\theta 13<\theta 11$).

Note that, as explained with reference to FIGS. 7A and 7B or FIGS. 8A and 8B, depending on the deposition method, the inclination angle $\theta 13$ of the end surface SS3 may be greater than the inclination angle $\theta 11$ of the end surface SS1 ($\theta 13>\theta 11$).

The end surface SS1 is located above the carrier adjustment layer CA1 and is in contact with the carrier adjustment layer CA2. The carrier adjustment layer CA2 is in contact with the carrier adjustment layer CA1 on an outer side of the light-emitting layer EL. The end surface SS3 is located above the insulating layer 12, exposed from the carrier adjustment layer CA2 and in contact with the upper electrode E2. The upper electrode E2 is in contact with the insulating layer 12 on an outer side of the carrier conditioning layer CA1.

Figure 16:
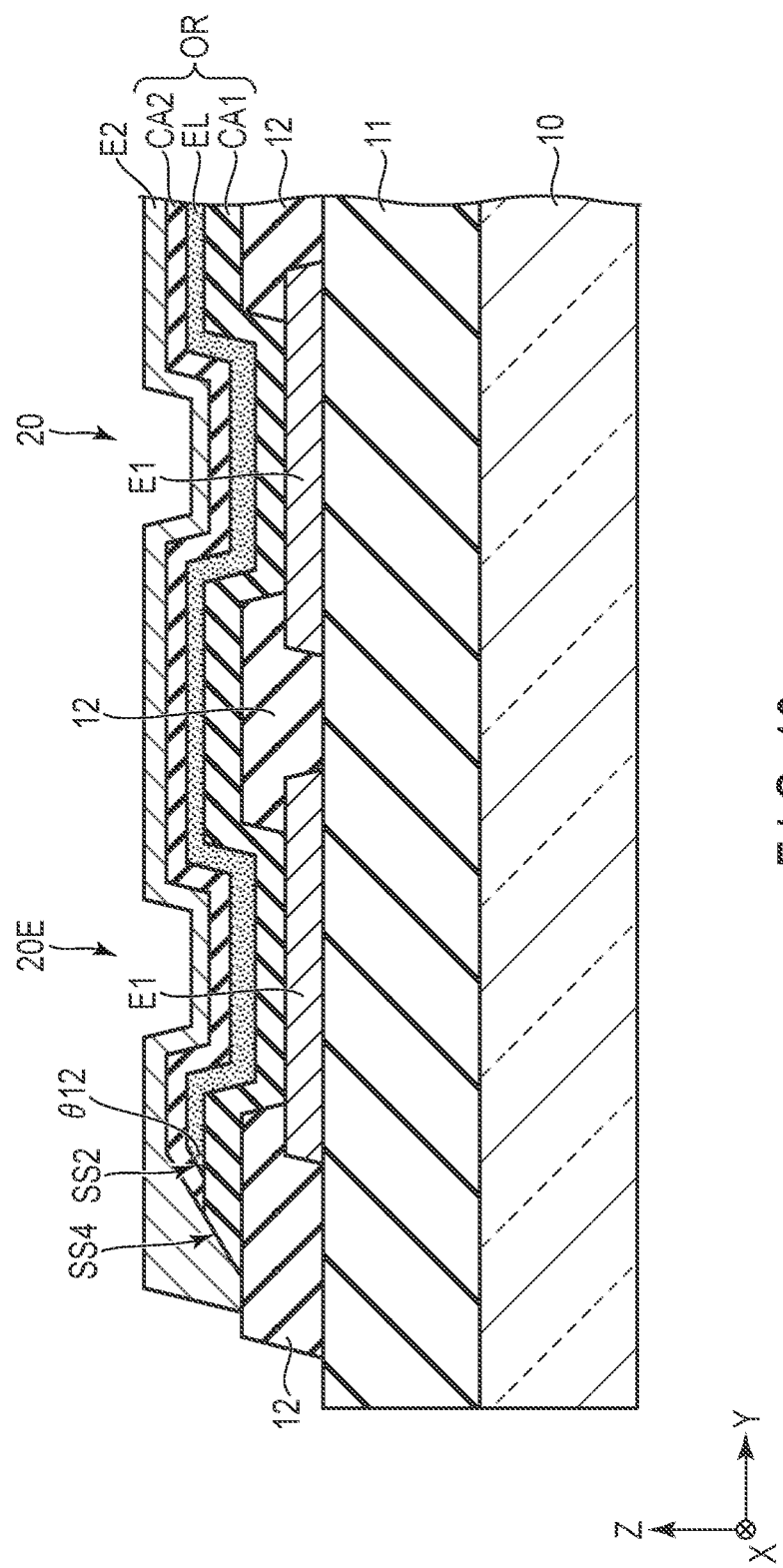
FIG. 16 is a cross sectional view showing an example of the display element 20, taken along line C-D in FIG. 14.

FIG. 16 is a cross-sectional view showing another example of the display element 20 taken along line C-D shown in FIG. 14.

The carrier adjustment layers CA1 and CA2 which constitute the organic layer OR, and the light-emitting layer EL are common layers continuously formed over the plurality of display elements 20 including the outermost display element 20E.

In the cross-sectional view taken along the Y-Z plane, the inclination angle θ11 of the end surface SS1 shown in FIG. 15 is greater than the inclination angle θ12 of the end surface SS2 shown in FIG. 16 (θ12<θ11).

The end surface SS2 is located above the carrier adjustment layer CA1 and is in contact with the carrier adjustment layer CA2. The carrier adjustment layer CA2 covers the entire light-emitting layer EL including the end surfaces SS1 and SS2. The end surface SS4 of the carrier adjustment layer CA1 is located above the insulating layer 12 and is in contact with the upper electrode E2. The upper electrode E2 is in contact with the insulating layer 12 on an outer side of the carrier adjustment layer CA1.

Next, a method of forming the light-emitting layer EL having the above-explained cross-sectional shape will be described.

Figure 17:
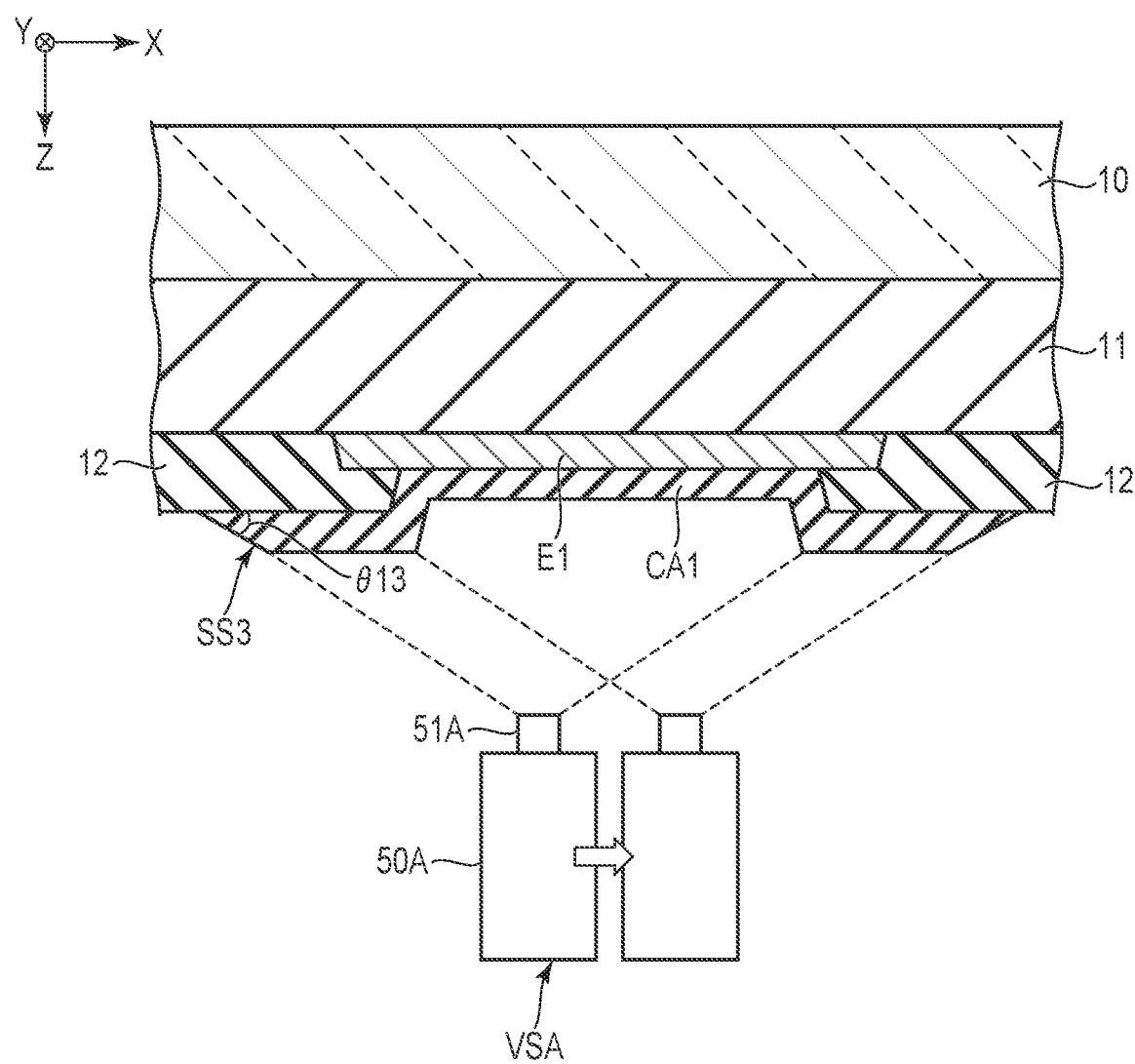
FIG. 17 is a diagram illustrating a method of manufacturing a plurality of display elements shown in FIG. 16.

FIG. 17 is a diagram illustrating a method of manufacturing the plurality of display elements 20 shown in FIG. 16.

First, a processing substrate SUB is prepared. Then, the processing substrate SUB is set such that the insulating layer 12 and the vapor deposition source (first vapor deposition source) VSA face each other.

Then, the carrier adjustment layer CA1 is formed by the vapor deposition method. The vapor deposition source VSA comprises a crucible 50A and a nozzle 51A connected to the crucible 50A. The crucible 50A contains a material (first material) for forming a functional layer. When forming a carrier adjustment layer CA1 including multiple functional layers, multiple crucibles are required, each containing a respective material for each respective functional layer, but here, for simplicity, only one crucible 50A is shown in the figure.

The vapor deposition source VSA is moved in the first direction X while emitting vapor. Thus, the emitted material is deposited, and a carrier adjustment layer CA1 including an end surface SS3 having an inclination angle θ13 is formed at a position overlapping the insulating layer 12. Note here that in the cross section taken along the direction perpendicular to the movement direction of the vapor deposition source VSA, the radiation angle of the vapor emitted from the vapor deposition source VSA is controlled, for example, by the technique described with reference to FIGS. 4 to 6.

FIG. 18 is a diagram illustrating the method of manufacturing a plurality of display elements 20 shown in FIG. 16.

The processing substrate SUB on which the carrier adjustment layer CA1 shown in FIG. 17 has already been formed, is set such that the carrier adjustment layer CA1 and a vapor deposition source (second vapor deposition source) VSB face each other.

Then, the light-emitting layer EL is formed by the vapor deposition method. The vapor deposition source VSB comprises a crucible 50B and a nozzle 51B connected to the crucible 50B. The crucible 50B contains a material (second material) for forming the light-emitting layer EL. As described above, since the light-emitting layer EL is a mixed layer of a host material and a light-emitting material, multiple crucibles are required, but for simplicity, only one crucible 50B is shown here in the figure.

For example, in the layout of sub-pixels shown in FIG. 2, when the display colors of the sub-pixels aligned along the second direction Y are the same, the movement direction of the vapor deposition source VSB to form the light-emitting layer EL is set along the second direction Y. In other words, the movement direction (second direction Y) of the vapor deposition source VSB and the movement direction (first direction X) of the vapor deposition source VSA are perpendicular to each other. The travel distance of the vapor deposition source VSB along the second direction Y is greater than the travel distance of the vapor deposition source VSA along the first direction X.

Note that when the display colors of the sub-pixels aligned in a diagonal direction different from the first direction X and the second direction Y are the same, the movement direction of the vapor deposition source VSB to form the light-emitting layer EL is set to the diagonal direction. In any case, the movement direction of the vapor deposition source VSB and the movement direction of the vapor deposition source VSA intersect each other in the X-Y plane.

The vapor deposition source VSB is moved along the second direction Y while emitting vapor. Thus, the emitted material is deposited, and a light-emitting layer EL including an end surface SS2 having an inclination angle θ12 is formed at a position overlapping the carrier adjustment layer CA1. Note that in the cross section taken along the direction perpendicular to the movement direction of the vapor deposition source VSB, the radiation angle of the vapor emitted from the vapor deposition source VSB is controlled, for example, by the technique described with reference to FIGS. 4 to 6.

FIG. 19 is a diagram illustrating the method of manufacturing the plurality of display elements 20 shown in FIG. 16.

A processing substrate SUB on which the light-emitting layer EL shown in FIG. 18 has already been formed, is set such that the light-emitting layer EL and a vapor deposition source (third vapor deposition source) VSC face each other.

Then, the carrier adjustment layer CA2 is formed by the vapor deposition method. The vapor deposition source VSC comprises a crucible 50C and a nozzle 51C connected to the crucible 50C. The crucible 50C contains a material (third materials) for forming a functional layer. In order to form a carrier adjustment layer CA2 including multiple functional layers, multiple crucibles are required, each containing a respective material for each functional layer, but here, for simplicity, only one crucible 50C is shown in the figure.

The vapor deposition source VSC is moved along the first direction X while emitting vapor. Thus, the emitted material is deposited and forms a carrier adjustment layer CA2 to cover the light-emitting layer EL. The carrier adjustment layer CA2 includes an end surface SS5 having an inclination angle θ15. Note that in the cross section taken along the direction perpendicular to the movement direction of the vapor deposition source VSC, the radiation angle of the vapor emitted from the vapor deposition source VSC is controlled, for example, by the technique described with reference to FIGS. 4 to 6.

In such an example, the peripheral portion of the light-emitting layer EL, especially, the end surface SS1, is reliably covered by the carrier adjustment layer CA2. Therefore, advantageous effects similar to those described above can be obtained.

Further, the end surface SS2 of the light-emitting layer EL in the display element 20E located at the outermost circumference can as well be definitely covered by the carrier adjustment layer CA2. Therefore, the light-emitting layer EL can be protected from outside air and moisture.

According to the embodiments described above, it is possible to provide a display device which can suppress the degradation in performance of the display element and also a method of manufacturing such a display device.

Based on the display device which has been described in the above-described embodiments, a person having ordinary skill in the art may achieve a display device with an arbitral design change; however, as long as they fall within the scope and spirit of the present invention, such a display device is encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:

1. A display device comprising:
a plurality of sub-pixels;
an insulating substrate;
a first insulating layer disposed above the insulating substrate;
a lower electrode disposed on the first insulating layer;
a second insulating layer disposed on the first insulating layer, and covering a peripheral portion of the lower electrode and comprising an opening overlapping the lower electrode;
an organic layer including a light-emitting layer, disposed in the opening and covering the lower electrode; and
an upper electrode covering the organic layer,
wherein
the sub-pixels of different display colors are located adjacent to each other in a first direction,
the sub-pixels of a same display color are aligned along a second direction intersecting the first direction,
each of sub-pixels comprises the lower electrode, the organic layer, and the upper electrode,
the light-emitting layer includes a first bottom surface, a first end surface and a second end surface intersecting the first end surface,
the organic layer further comprises a first carrier adjustment layer located between the lower electrode and the light-emitting layer, and a second carrier adjustment layer located between the light-emitting layer and the upper electrode,
each of the first carrier adjustment layer, the light-emitting layer, and the second carrier adjustment layer extends above the second insulating layer,
the first end surface and the second end surface are located above the first carrier adjustment layer outside the opening and in contact with the second carrier adjustment layer,
the second carrier adjustment layer covers the light-emitting layer and the first carrier adjustment layer, and an angle between the first end surface and the first bottom surface in a cross-sectional view along the first direction is greater than an angle between the second end surface and the first bottom surface in a cross-sectional view along the second direction.

2. The display device of claim 1, wherein
the first carrier adjustment layer includes a second bottom surface and a third end surface, and
in a cross-sectional view along the first direction, an angle between the third end surface and the second bottom surface is less than an angle between the first end surface and the first bottom surface.

3. The display device of claim 2, wherein
the second carrier adjustment layer exposes the third end surface, and
the upper electrode covers the third end surface.

4. The display device of claim 1,
wherein the sub-pixels of a same display color are aligned along the second direction.

5. The display device of claim 1, wherein
a length of the first end surface along the second direction is greater than a length of the second end surface along the first direction.

* * * * *